United States Patent
Sasaki et al.

(10) Patent No.: US 6,727,040 B2
(45) Date of Patent: Apr. 27, 2004

(54) POSITIVE RESIST COMPOSITION TO BE IRRADIATED WITH ONE OF AN ELECTRON BEAM AND X-RAY

(75) Inventors: Tomoya Sasaki, Shizuoka (JP); Kazuyoshi Mizutani, Shizuoka (JP); Koji Shirakawa, Shizuoka (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 48 days.

(21) Appl. No.: 10/024,358

(22) Filed: Dec. 21, 2001

(65) Prior Publication Data

US 2002/0136980 A1 Sep. 26, 2002

(30) Foreign Application Priority Data

Dec. 28, 2000 (JP) .................................... P. 2000-402591

(51) Int. Cl.$^7$ .............................................. G03F 7/004
(52) U.S. Cl. ................... 430/270.1; 430/296; 430/914; 430/942; 430/966
(58) Field of Search .............................. 430/270.1, 966, 430/296, 942, 914

(56) References Cited

U.S. PATENT DOCUMENTS 6,265,135 B1 * 7/2001 Kodama et al. ......... 430/286.1

OTHER PUBLICATIONS

Ionization Energies of Gas–Phase Molecules, CRC Handbook of Chemistry and Physics, 3$^{rd}$. electronic ed. 2000.*
Nagahara, et al. "Radiation Chemistry of Triphenylsulfonium Salts in EB and X–Ray Chemically Amplified Resists—Proton Generation Mechanisms." Journal of Photopolymer Science and Technology. vol. 11, No. 4. (1998), pp. 577–580.

* cited by examiner

Primary Examiner—Rosemary Ashton
(74) Attorney, Agent, or Firm—Sughrue Mion, PLLC

(57) ABSTRACT

A positive resist composition to be irradiated with one of an electron beam and X-ray, comprises: (a) a compound capable of generating an acid upon irradiation with one of electron beam and X-ray; (b1) a resin: increasing the solubility in an alkali developer by the action of an acid; and having a group capable of leaving by the action of an acid, in which the leaving group includes a residue of a compound, the compound having a smaller ionization potential value than p-ethylphenol; and (c) a solvent.

15 Claims, No Drawings

POSITIVE RESIST COMPOSITION TO BE IRRADIATED WITH ONE OF AN ELECTRON BEAM AND X-RAY

FIELD OF THE INVENTION

The present invention relates to a positive resist composition to be irradiated with one of an electron beam and X-ray, in particular, relates to a chemical amplification system positive resist composition to be irradiated with one of an electron beam and X-ray, which is excellent in a pattern profile obtained by irradiation with electron beams or X-rays, and is high sensitivity.

BACKGROUND OF THE INVENTION

The degree of integration of integrated circuits has been heightened more and more, and processing of ultra-fine pattern comprising a line width of half a micrometer or less has been required in the manufacture of semiconductor substrates, such as ultra LSI. For satisfying the necessity, the wavelengths used in an exposure apparatus for photolithography have become short more and more, and the use of far ultraviolet rays and excimer laser rays (XeCl, KrF and ArF) has been discussed now. Still further ultra-fine pattern formation by electron beams or X-rays has been discussed.

In particular, electron beams or X-rays are positioned as the pattern forming technique of the next generation or the next of the next generation, and the development of positive and negative resist compositions capable of obtaining high sensitivity, high resolution power and a rectangular profile has been desired.

Further, positive resists for electron beams or X-rays are easily influenced by basic contaminants in the air, or liable to be influenced by being exposed to air in and out of an irradiation apparatus (drying of the film), and the surface of the resists becomes hardly soluble. As a result, there arises a problem that the resists become a T-top shape (the surface forms T-shaped eaves) in case of a line pattern, and the surface becomes a capping shape (eaves are formed on the contact hole surface) in case of a contact hole pattern.

On the other hand, there arises a problem of film decrease when the binder is made hydrophilic for the purpose of preventing the capping shape or the T-top shape.

As the mechanism of acid generation from an onium salt series acid generating agent by electron beams or X-rays in a chemical amplification resist, the mechanism that a secondary electron is emitted after almost all the radiation energy is absorbed by the matrix polymer, and the onium salt is reduced by the secondary electron, thereby an acid is generated is described in *Journal of Photopolymer Science and Technology*, Vol. 11, No. 4, pp. 577 to 580 (1998).

The entire process of electron beam or X-ray exposure is generally performed in a high vacuum, but when the resist is allowed to stand in a high vacuum after exposure, the stability of the resist performance is sometimes malignantly influenced.

From the above point of view, a resist excellent in sensitivity, resolution and PED (post exposure delay) stability in a vacuum has been desired. PED stability is the stability of a coated film in case of allowing the film to stand in and out of the irradiation apparatus during the time until heating treatment is performed after irradiation.

SUMMARY OF THE INVENTION

An object of the present invention is to provide a positive resist composition for electron beams or X-rays which is high sensitivity, high resolution and excellent in PED stability.

As a result of eager investigations aiming at high performances of resist compositions, the present inventors have found that a resist which is high sensitivity, high resolution and excellent in stability in a vacuum can be obtained by using a polymer having a group containing a structure having an ionization potential value (Ip) smaller than the Ip of a p-hydroxystyrene unit (p-ethylphenol) (Ip: about 8.9 eV). That is, the above object of the present invention has been achieved by the following positive resist composition for electron beams or X-rays of the present invention.

(1) A positive resist composition to be irradiated with one of an electron beam and X-ray, which comprises:

(a) a compound capable of generating an acid upon irradiation with one of electron beam and X-ray;

(b1) a resin: increasing the solubility in an alkali developer by the action of an acid; and having a group capable of leaving by the action of an acid, in which the leaving group includes a residue of a compound, the compound having a smaller ionization potential value than p-ethylphenol; and (c) a solvent.

(2) A positive resist composition to be irradiated with one of an electron beam and X-ray, which comprises:

(a) a compound capable of generating an acid upon irradiation with one of electron beam and X-ray;

(b2) a resin: increasing the solubility in an alkali developer by the action of an acid; and having a repeating unit represented by formula (I):

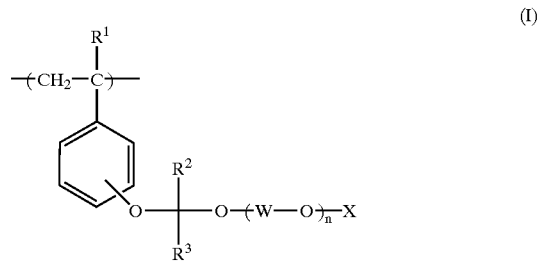

(I)

wherein $R^1$ represents a hydrogen atom or a methyl group; $R^2$ and $R^3$ each independently represents a hydrogen atom or an alkyl group having from 1 to 4 carbon atoms; W represents a divalent organic group; X represents an organic group which satisfies that the ionization potential value of a compound represented by H—O—X is smaller than that of p-ethylphenol; and n represents an integer of from 1 to 4, and when n represents from 2 to 4, a plurality of W's are the same or different; and (c) a solvent.

(3) The positive resist composition as described in item (2), wherein X in formula (I) is represented by formula (II):

(II)

wherein L represents a single bond or an alkylene group; and Y represents a group selected from the following formulae:

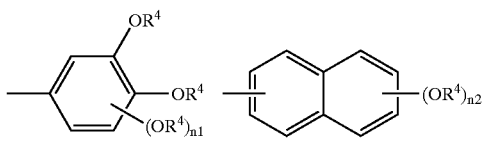

-continued

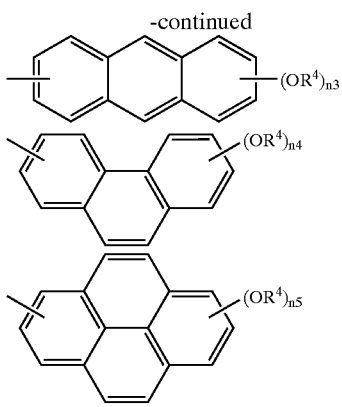

wherein $R^4$ represents a straight chain or branched alkyl group having from 1 to 6 carbon atoms; n1 represents an integer of from 0 to 3; n2 represents an integer of from 0 to 7; n3 represents an integer of from 0 to 9; n4 represents an integer of from 0 to 9; and n5 represents an integer of from 0 to 9.

(4) The positive resist composition as described in item (1), wherein the compound (a) contains at least one compound represented by formula (I'), (II') or (III'):

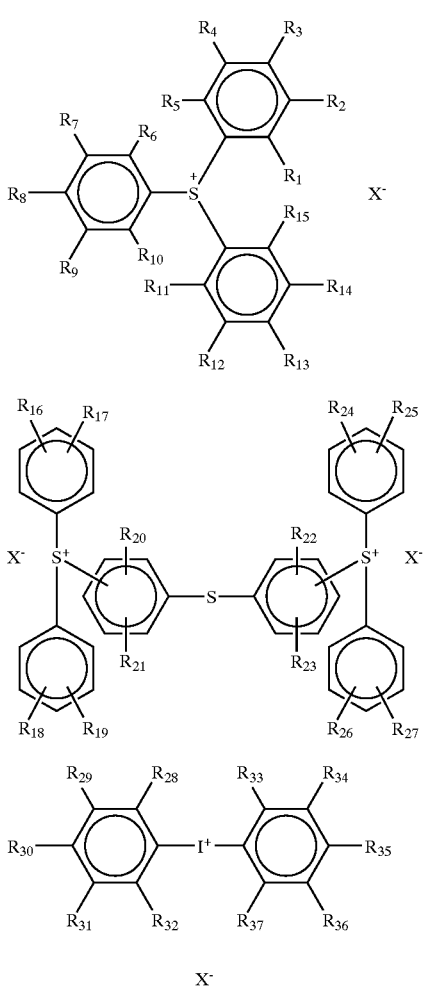

wherein $R_1$ to $R_{37}$, which are the same or different, each represents a hydrogen atom, a straight chain, branched or cyclic alkyl group, a straight chain, branched or cyclic alkoxyl group, a hydroxyl group, a halogen atom, or an —S—$R_{38}$ group; $R_{38}$ represents a straight chain, branched or cyclic alkyl group, or an aryl group; at least two of $R_1$ to $R_{15}$, at least two of $R_{16}$ to $R_{27}$, and at least two of $R_{28}$ to $R_{37}$ may be bonded to form a ring containing at least one selected from a single bond, carbon, oxygen, sulfur and nitrogen; and $X^-$ represents an anion of a sulfonic acid.

(5) The positive resist composition as described in item (4), wherein $X^-$ represents an anion of a benzenesulfonic acid, an anion of a naphthalenesulfonic acid or an anion of an anthracenesulfonic acid, each of which contains at least one member selected from the group consisting of:

at least one fluorine atom;

a straight chain, branched or cyclic alkyl group substituted with at least one fluorine atom;

a straight chain, branched or cyclic alkoxyl group substituted with at least one fluorine atom;

an acyl group substituted with at least one fluorine atom;

an acyloxy group substituted with at least one fluorine atom;

a sulfonyl group substituted with at least one fluorine atom;

a sulfonyloxy group substituted with at least one fluorine atom;

a sulfonylamino group substituted with at least one fluorine atom;

an aryl group substituted with at least one fluorine atom;

an aralkyl group substituted with at least one fluorine atom; and an alkoxycarbonyl group substituted with at least one fluorine atom.

(6) The positive resist composition as described in item (1), wherein the solvent (c) contains propylene glycol monomethyl ether acetate.

(7) The positive resist composition as described in item (1), which further comprises (e) an organic basic compound.

(8) The positive resist composition as described in item (1), which further comprises (f) a surfactant containing at least one of a fluorine atom and a silicon atom.

(9) The positive resist composition as described in item (2), wherein the compound (a) contains at least one compound represented by formula (I'), (II') or (III'):

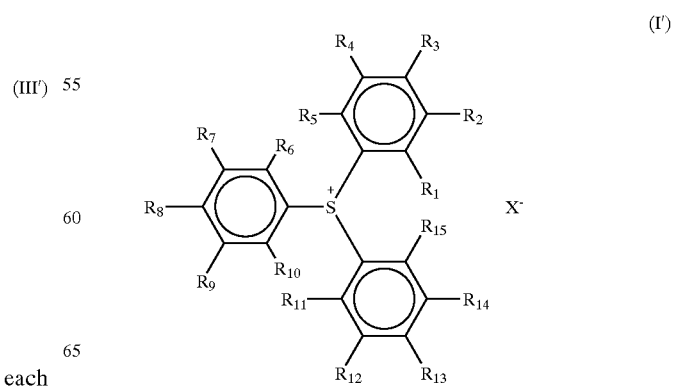

-continued

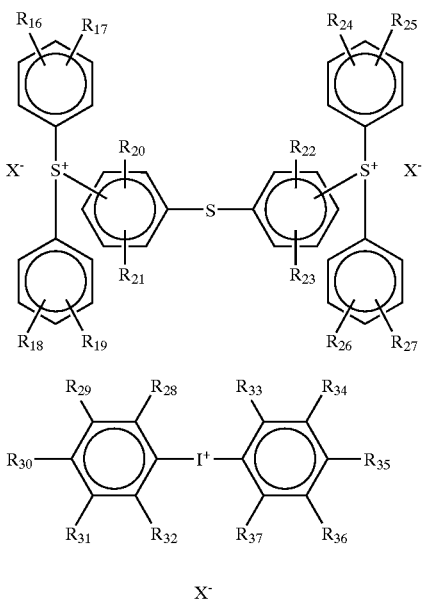

wherein $R_1$ to $R_{37}$, which are the same or different, each represents a hydrogen atom, a straight chain, branched or cyclic alkyl group, a straight chain, branched or cyclic alkoxyl group, a hydroxyl group, a halogen atom, or an —S—$R_{38}$ group; $R_{38}$ represents a straight chain, branched or cyclic alkyl group, or an aryl group; at least two of $R_1$ to $R_{15}$, at least two of $R_{16}$ to $R_{27}$, and at least two of $R_{28}$ to $R_{37}$ may be bonded to form a ring containing at least one selected from a single bond, carbon, oxygen, sulfur and nitrogen; and X⁻ represents an anion of a sulfonic acid.

(10) The positive resist composition as described in item (9), wherein X⁻ represents an anion of a benzenesulfonic acid, an anion of a naphthalenesulfonic acid or an anion of an anthracenesulfonic acid, each of which contains at least one member selected from the group consisting of:

at least one fluorine atom;

a straight chain, branched or cyclic alkyl group substituted with at least one fluorine atom;

a straight chain, branched or cyclic alkoxyl group substituted with at least one fluorine atom;

an acyl group substituted with at least one fluorine atom;

an acyloxy group substituted with at least one fluorine atom;

a sulfonyl group substituted with at least one fluorine atom;

a sulfonyloxy group substituted with at least one fluorine atom;

a sulfonylamino group substituted with at least one fluorine atom;

an aryl group substituted with at least one fluorine atom;

an aralkyl group substituted with at least one fluorine atom; and an alkoxycarbonyl group substituted with at least one fluorine atom.

(11) The positive resist composition as described in item (2), wherein the solvent (c) contains propylene glycol monomethyl ether acetate.

(12) The positive resist composition as described in item (2), which further comprises (e) an organic basic compound.

(13) The positive resist composition as described in item (2), which further comprises (f) a surfactant containing at least one of a fluorine atom and a silicon atom.

(14) A method for forming a pattern comprises: applying the positive resist composition according to item (1) on a substrate to form a resist film; irradiating the resist film with one of an electron beam and X-ray; and developing the resist film.

(15) A method for forming a pattern comprises: applying the positive resist composition according to item (2) on a substrate to form a resist film; irradiating the resist film with one of an electron beam and X-ray; and developing the resist film.

DETAILED DESCRIPTION OF THE INVENTION

The positive resist composition to be irradiated with one of an electron beam and X-ray according to the present invention (hereinafter also referred to as "positive electron beam or X-ray resist composition") is described below.

[I] Compound Capable of Generating an Acid Upon Irradiation with one of Electron Beam and X-ray (hereinafter also referred to as component (a))

Any compounds which can generate an acid by irradiation with electron beams or X-rays can be used as component (a) but compounds represented by formulae (I'), (II') and (III') are preferably used.

In formulae (I'), (II') and (III'), as the straight chain or branched alkyl group represented by $R_1$ to $R_{38}$, an alkyl group having from 1 to 4 carbon atoms (e.g., methyl, ethyl, propyl, n-butyl, sec-butyl and t-butyl) can be exemplified, which may have a substituent. As the cyclic alkyl group represented by $R_1$ to $R_{38}$, an cyclic alkyl group having from 3 to 8 carbon atoms (e.g., cyclopropyl, cyclopentyl and cyclohexyl) can be exemplified, which may have a substituent.

As the straight chain or branched alkoxyl group represented by $R_1$ to $R_{37}$, an alkoxyl group having from 1 to 4 carbon atoms (e.g., methoxy, ethoxy, hydroxyethoxy, propoxy, n-butoxy, isobutoxy, sec-butoxy and t-butoxy) can be exemplified.

As the cyclic alkoxyl group represented by $R_1$ to $R_{37}$, a cyclopentyloxy group and a cyclohexyloxy group can be exemplified.

As the halogen atom represented by $R_1$ to $R_{37}$, fluorine, chlorine, bromine and iodine can be exemplified.

As the aryl group represented by $R_{38}$, an aryl group having from 6 to 14 carbon atoms (e.g., phenyl, tolyl, methoxyphenyl and naphthyl) can be exemplified, which may have a substituent.

The examples of the substituents include preferably an alkoxyl group having from 1 to 4 carbon atoms, a halogen atom (e.g., fluorine, chlorine, bromine and iodine), an aryl group having from 6 to 10 carbon atoms, an alkenyl group having from 2 to 6 carbon atoms, a cyano group, a hydroxyl group, a carboxyl group, an alkoxycarbonyl group and a nitro group.

The examples of the rings: containing at least one selected from a single bond, carbon, oxygen, sulfur and nitrogen; and being formed by bonding two or more of $R_1$ to $R_{15}$, two or more of $R_{16}$ to $R_{27}$, and two or more of $R_{28}$ to $R_{37}$, include a furan ring, a dihydrofuran ring, a pyran ring, a trihydropyran ring, a thiophene ring, and a pyrrole ring.

In formulae (I'), (II') and (III'), X⁻ represents an anion of a sulfonic acid.

As the examples of a sulfonic acid anion, a perfluoroalkanesulfonic acid anion such as $CF_3SO_3^-$, a pentafluorobenzenesulfonic acid anion, a condensed polynuclear aromatic sulfonic acid anion such as a naphthalene-1-sulfonic acid anion, an anthraquinonesulfonic acid anion, and a sulfonic acid group-containing dye can be exemplified, but the present invention is not limited thereto.

X⁻ preferably represents a benzenesulfonic acid anion, a naphthalenesulfonic acid anion, or an anthracenesulfonic acid anion, each of which has at least one group selected from the group consisting of at least one fluorine atom, a straight chain, branched or cyclic alkyl group substituted with at least one fluorine atom, a straight chain, branched or cyclic alkoxyl group substituted with at least one fluorine atom, an acyl group substituted with at least one fluorine atom, an acyloxy group substituted with at least one fluorine atom, a sulfonyl group substituted with at least one fluorine atom, a sulfonyloxy group substituted with at least one fluorine atom, a sulfonylamino group substituted with at least one fluorine atom, an aryl group substituted with at least one fluorine atom, an aralkyl group substituted with at least one fluorine atom, and an alkoxycarbonyl group substituted with at least one fluorine atom .

The above straight chain, branched or cyclic alkyl group is preferably an alkyl group having from 1 to 12 carbon atoms and substituted with from 1 to 25 fluorine atoms. The specific examples include a trifluoromethyl group, a pentafluoroethyl group, a 2,2,2-trifluoroethyl group, a heptafluoropropyl group, a heptafluoroisopropyl group, a perfluorobutyl group, a perfluorooctyl group, a perfluorododecyl group, and a perfluorocyclohexyl group. A perfluoroalkyl group having from 1 to 4 carbon atoms in which all the substituents are fluorine atoms is preferred above all.

The above straight chain, branched or cyclic alkoxyl group is preferably an alkoxyl group having from 1 to 12 carbon atoms and substituted with from 1 to 25 fluorine atoms. The specific examples include a trifluoromethoxy group, a pentafluoroethoxy group, a heptafluoroisopropyloxy group, a perfluorobutoxy group, a perfluorooctyloxy group, a perfluorododecyloxy group, and a perfluorocyclohexyloxy group. A perfluoroalkoxy group having from 1 to 4 carbon atoms in which all the substituents are fluorine atoms is preferred above all.

The above acyl group is preferably an acyl group having from 2 to 12 carbon atoms and substituted with from 1 to 23 fluorine atoms. The specific examples include a trifluoroacetyl group, a fluoroacetyl group, a pentafluoropropionyl group, and a pentafluorobenzoyl group.

The above acyloxy group is preferably an acyloxy group having from 2 to 12 carbon atoms and substituted with from 1 to 23 fluorine atoms. The specific examples include a trifluoroacetoxy group, a fluoroacetoxy group, a pentafluoropropionyloxy group, and a pentafluorobenzoyloxy group.

The above sulfonyl group is preferably a sulfonyl group having from 1 to 12 carbon atoms and substituted with from 1 to 25 fluorine atoms. The specific examples include a trifluoromethanesulfonyl group, a pentafluoroethanesulfonyl group, a perfluorobutanesulfonyl group, a perfluorooctanesulfonyl group, a pentafluorobenzenesulfonyl group, and a 4-trifluoromethylbenzenesulfonyl group.

The above sulfonyloxy group is preferably a sulfonyloxy group having from 1 to 12 carbon atoms and substituted with from 1 to 25 fluorine atoms. The specific examples include a trifluoromethanesulfonyloxy group, a perfluorobutanesulfonyloxy group, and a 4-trifluoromethylbenzenesulfonyloxy group.

The above sulfonylamino group is preferably a sulfonylamino group having from 1 to 12 carbon atoms and substituted with from 1 to 25 fluorine atoms. The specific examples include a trifluoromethanesulfonylamino group, a perfluorobutanesulfonylamino group, a perfluorooctanesulfonylamino group, and a pentafluorobenzenesulfonylamino group.

The above aryl group is preferably an aryl group having from 6 to 14 carbon atoms and substituted with from 1 to 9 fluorine atoms. The specific examples include a pentafluorophenyl group, a 4-trifluoromethylphenyl group, a heptafluoronaphthyl group, a nonafluoroanthranyl group, a 4-fluorophenyl group, and a 2,4-difluorophenyl group.

The above aralkyl group is preferably an aralkyl group having from 7 to 10 carbon atoms and substituted with from 1 to 15 fluorine atoms. The specific examples include a pentafluorophenylmethyl group, a pentafluorophenylethyl group, a perfluorobenzyl group, and a perfluorophenethyl group.

The above alkoxycarbonyl group is preferably an alkoxycarbonyl group having from 2 to 13 carbon atoms and substituted with from 1 to 25 fluorine atoms. The specific examples include a trifluoromethoxycarbonyl group, a pentafluoroethoxycarbonyl group, a pentafluorophenoxycarbonyl group, a perfluorobutoxycarbonyl group, and a perfluorooctyloxycarbonyl group.

X⁻ most preferably represents benzenesulfonic acid anion substituted with a fluorine atom, and a pentafluorobenzenesulfonic acid anion is preferred above all.

The above benzenesulfonic acid, naphthalenesulfonic acid or anthracenesulfonic acid each containing a fluorine-containing substituent may further be substituted with a straight chain, branched or cyclic alkoxyl group, an acyl group, an acyloxy group, a sulfonyl group, a sulfonyloxy group, a sulfonylamino group, an aryl group, an aralkyl group, an alkoxycarbonyl group (the ranges of carbon atoms of these groups are the same as those described above), a halogen atom (exclusive of a fluorine atom), a hydroxyl group, or a nitro group.

The specific examples of the compounds represented by formula (I') are shown below.

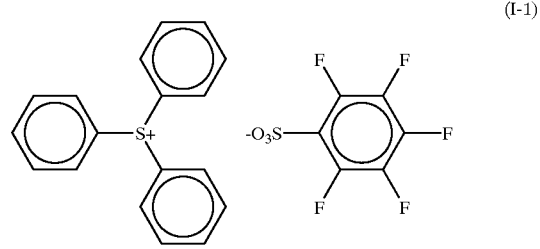

(I-1)

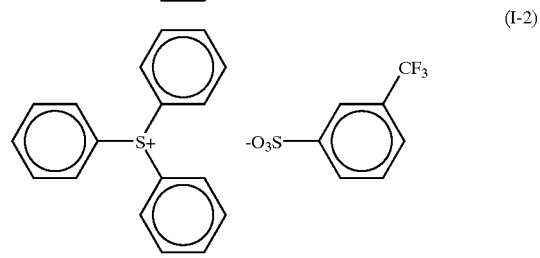

(I-2)

(I-3)
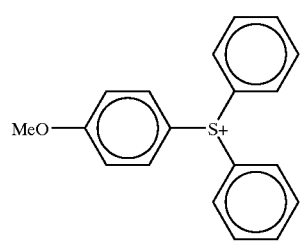
(I-9)
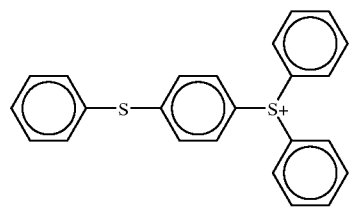
(I-4)
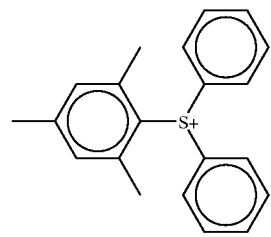
(I-10)
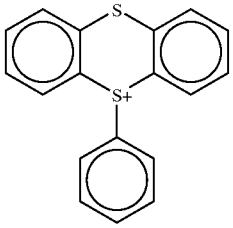 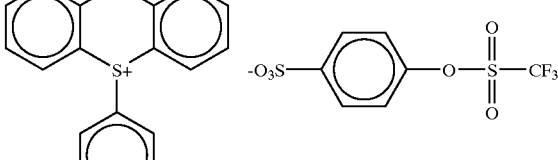
(I-5)
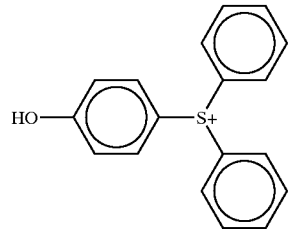
(I-11)
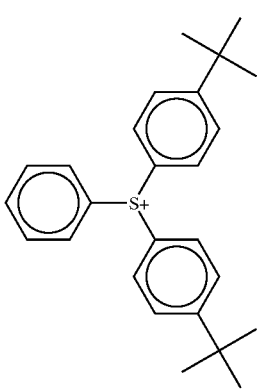
(I-6)
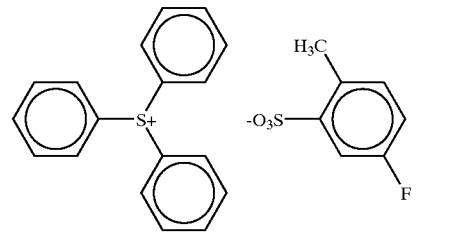
(I-7)
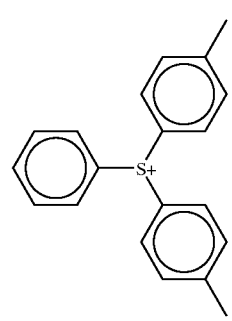
(I-12)
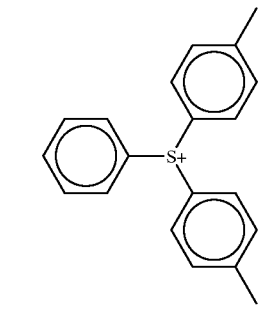
(I-8)
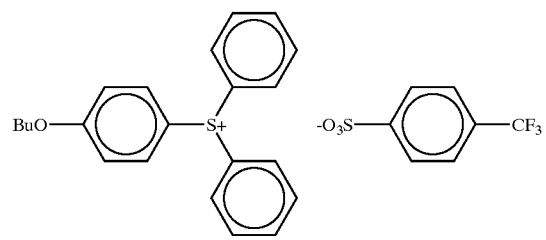
(I-13)
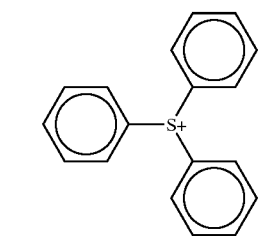

(I-14)
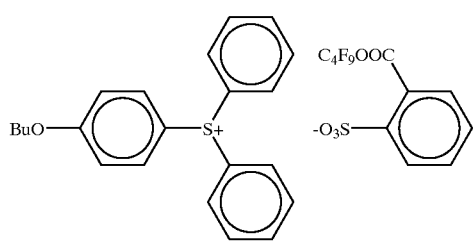
(I-23)
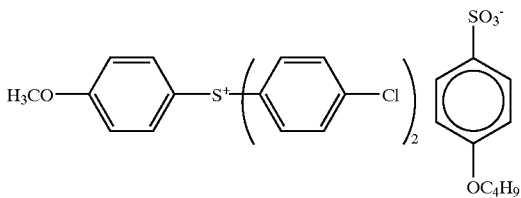
(I-15)
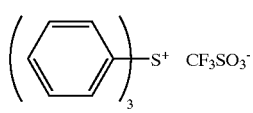
(I-24)
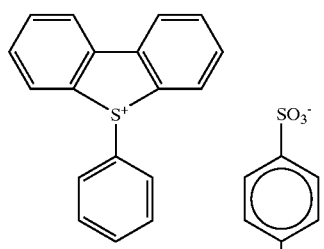
(I-16)
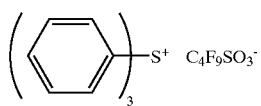
(I-17)
(I-25)
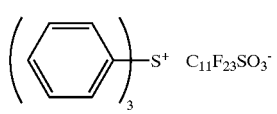
(I-18)
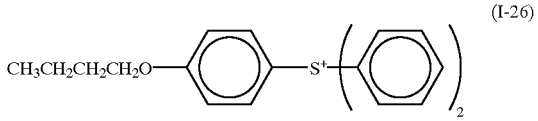
(I-19)
(I-26)
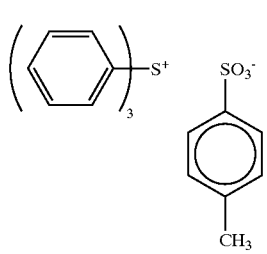
(I-20)
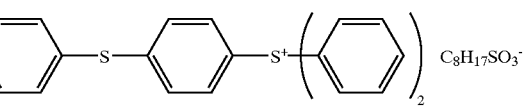
(I-27)
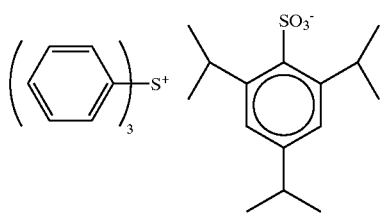
(I-21)
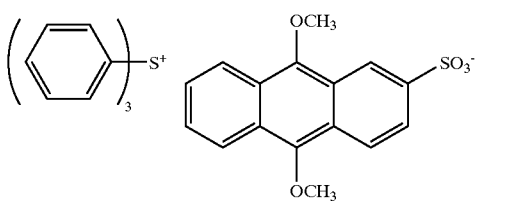
(I-28)
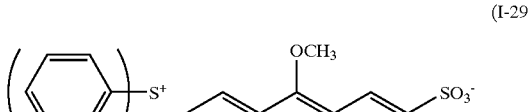
(I-22)
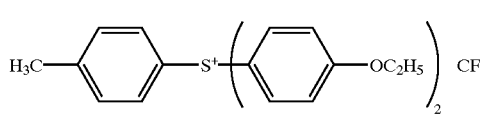
(I-29)
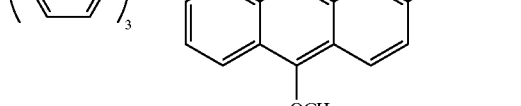

-continued
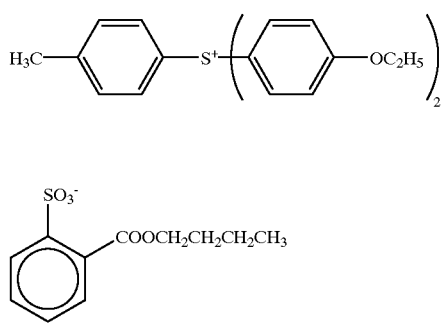
(I-30)
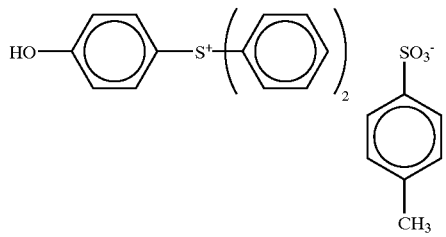
(I-31)
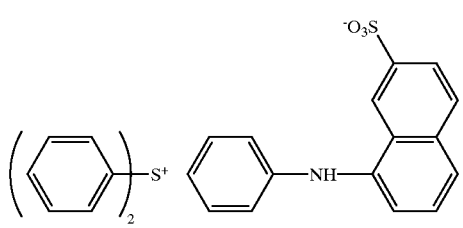
(I-32)
The specific examples of the compounds represented by formula (II') are shown below.
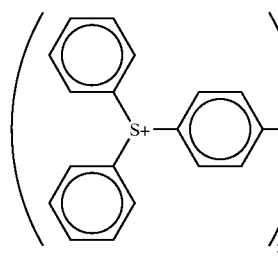
(II-1)
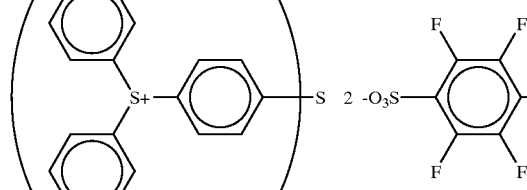
(II-2)
-continued
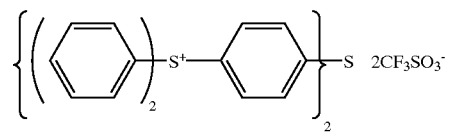
(II-3)
(II-4)
(II-5)
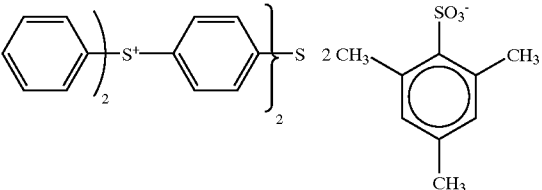
(II-6)
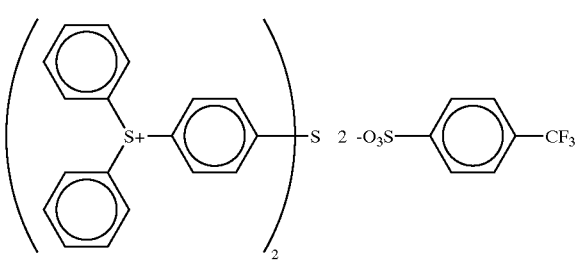
(II-7)
The specific examples of the compounds represented by formula (III') are shown below.
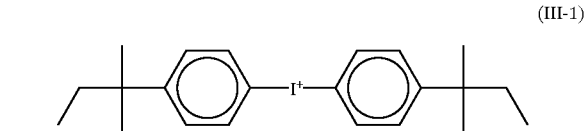
(III-1)

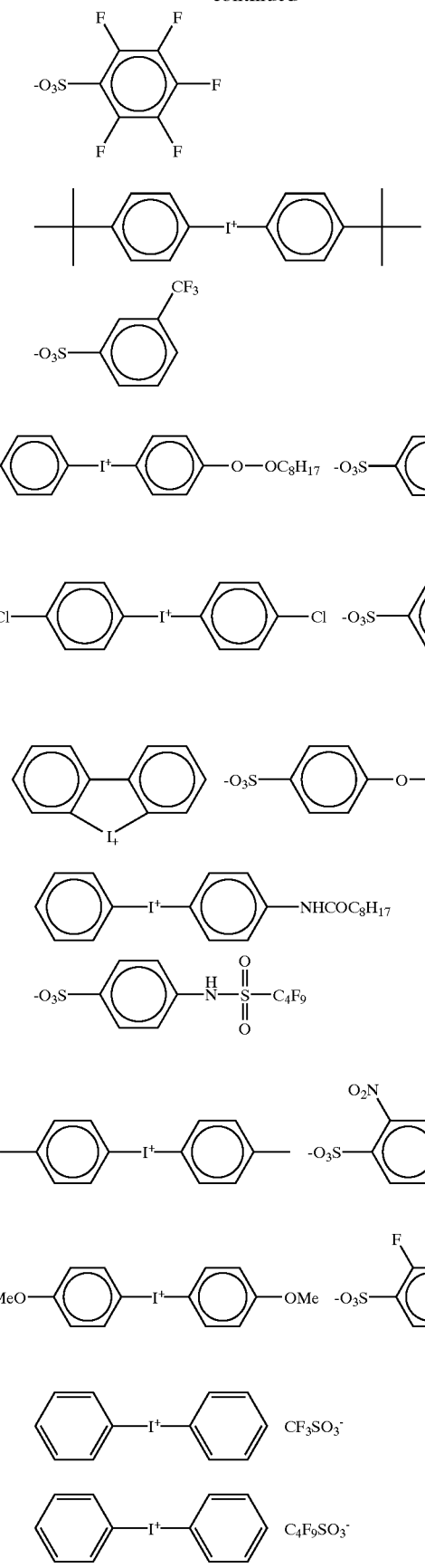
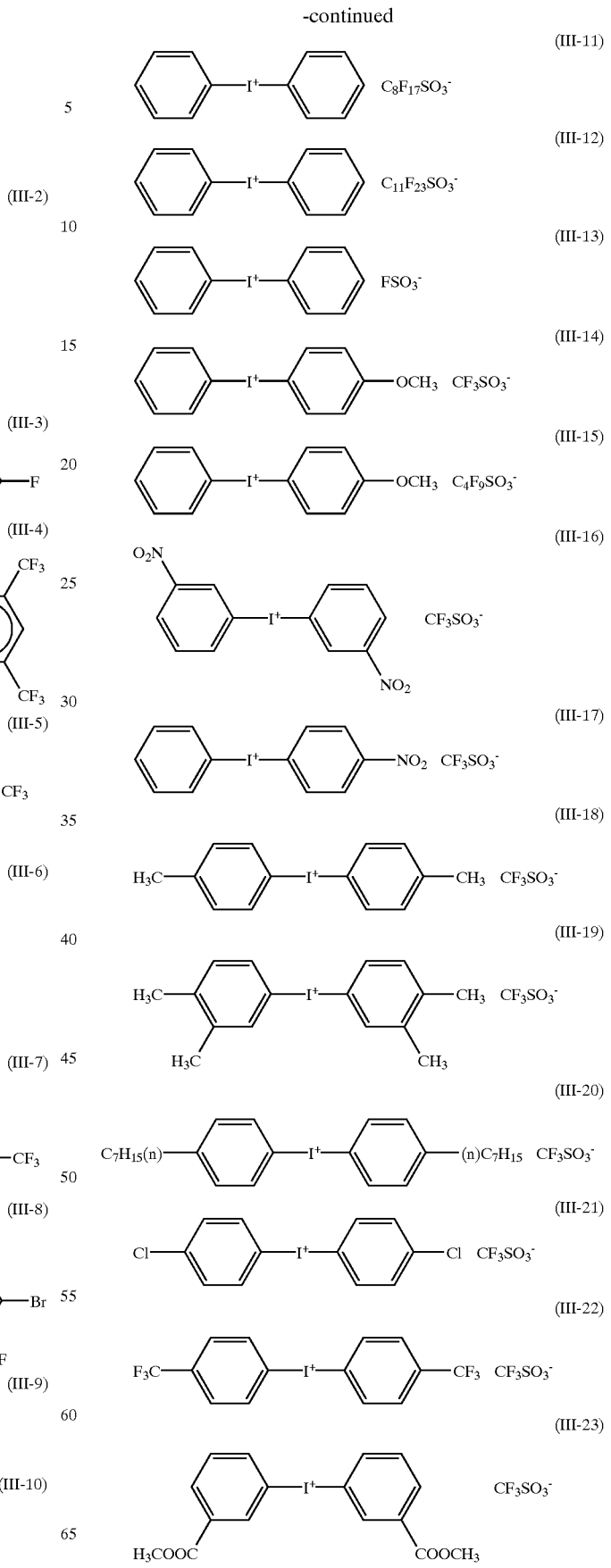

(III-24)
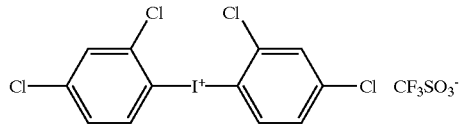
(III-25)
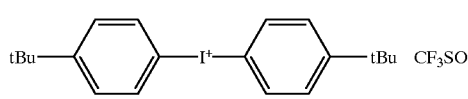
(III-26)
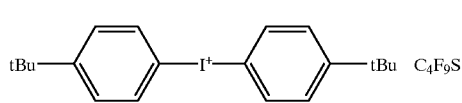
(III-27)
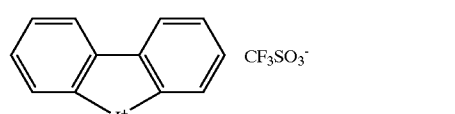
(III-28)
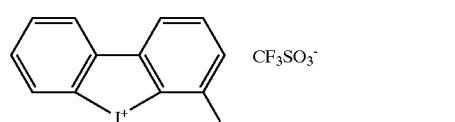
(III-29)
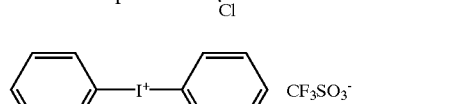
(III-30)
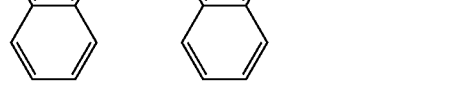
(III-31)
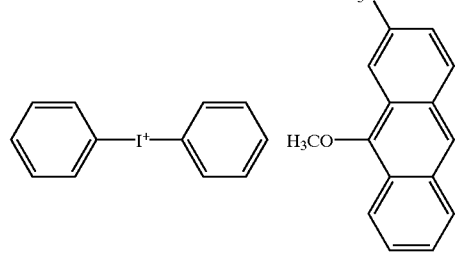
(III-32)
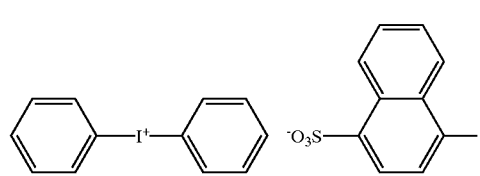
(III-33)
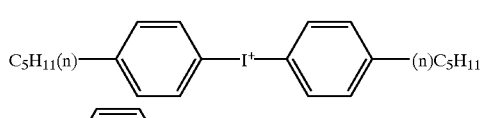
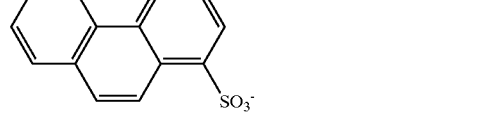
(III-34)
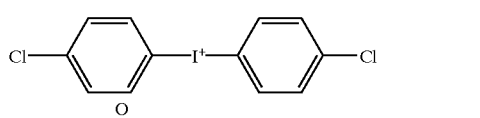
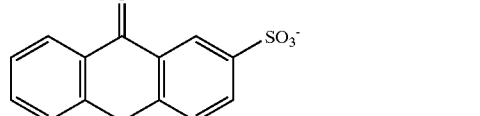
(III-35)
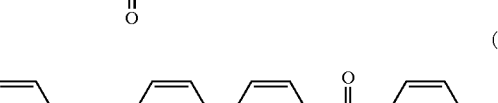
The specific examples of acid generating agents other than the compounds represented by formula (I') to (III') are shown below.
(PAG4-1)
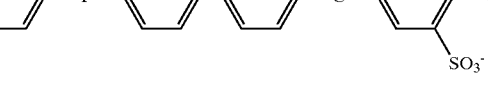
(PAG4-2)
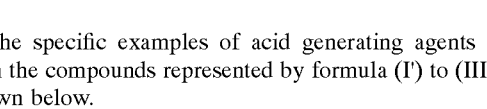
(PAG4-3)
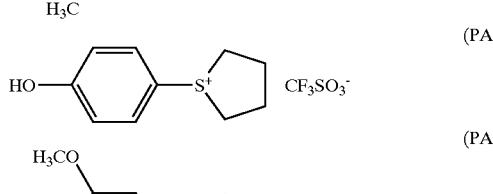
(PAG4-4)
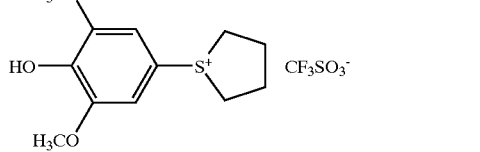

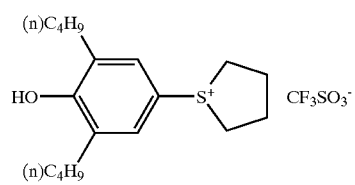 (PAG4-5)

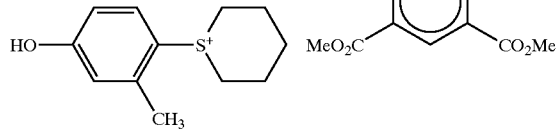 (PAG4-6)

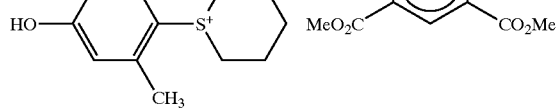 (PAG4-7)

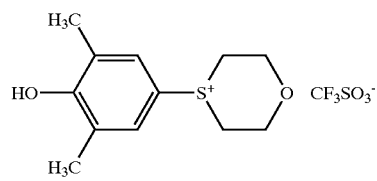 (PAG4-8)

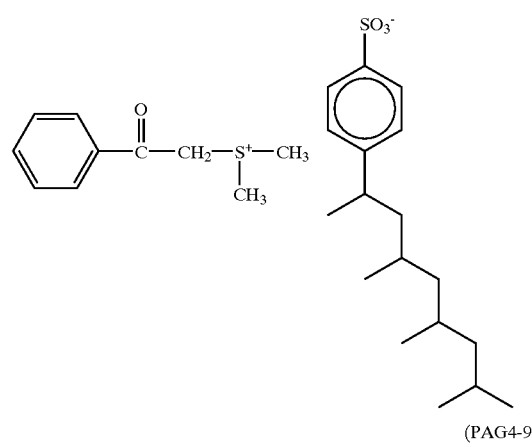 (PAG4-9)

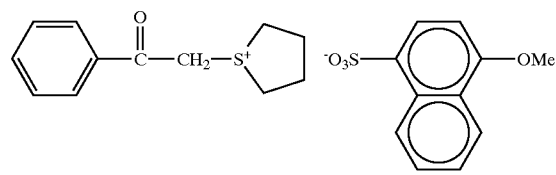 (PAG4-10)

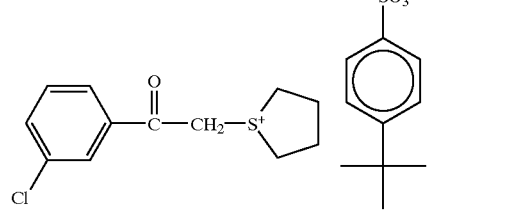 (PAG4-11)

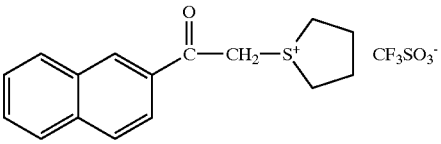 (PAG4-12)

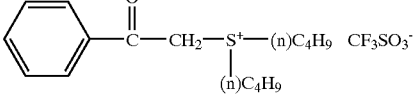 (PAG4-13)

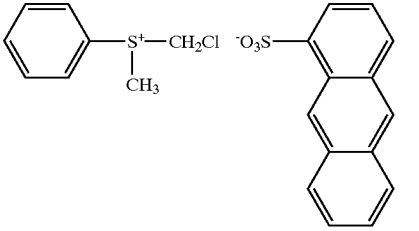 (PAG4-14)

The compounds represented by formulae (II'), (II') and (III') may be used alone, or may be used in combination of two or more.

The compounds represented by formulae (I') and (II') can be synthesized, for example, by a method comprising the steps of reacting an aryl Grignard reagent, e.g., arylmagnesiumbromide, with a substituted or unsubstituted phenyl sulfoxide, and subjecting the obtained triarylsulfoniun halide to a salt exchange reaction with an equivalent sulfonic acid, a method comprising the steps of condensing a substituted or unsubstituted phenyl sulfoxide and an equivalent aromatic compound using an acid catalyst, e.g., methanesulfonic acid/diphosphorus pentoxide or an aluminum chloride, and subjecting the obtained product to a salt exchange reaction, or a method comprising the steps of condensing a diaryliodonium salt and a diaryl sulfide using a catalyst, e.g., a copper acetate, and subjecting the obtained product to a salt exchange reaction.

The compound represented by formula (III') can be synthesized by subjecting an aromatic compound to a reaction using periodate.

The sulfonic acid or sulfonate for use in the salt exchange reaction can be obtained by a method of hydrolyzing a commercially available sulfonic acid chloride, a method of reacting an aromatic compound and a chlorosulfonic acid, or a method of reacting an aromatic compound and a sulfamic acid.

The specific synthesis methods of the compounds represented by formulae (I'), (II') and (III') are described below.
Synthesis of Pentafluorobenzenesulfonic Acid Tetramethylammonium Salt Pentafluorobenzenesulfonyl chloride (25 g) was dissolved in 100 ml of methanol with ice-cooling, and 100 g of a 25% aqueous solution of tetramethylammonium hydroxide was gradually added thereto. The reaction mixture was stirred at room temperature for 3 hours, thereby a solution of pentafluorobenzenesulfonic acid tetramethylammonium salt was obtained. This solution was used for salt exchange of a sulfonium salt and an iodonium salt.
Synthesis of Triphenylsulfonium Pentafluorobenzenesulfonate Exemplified Compound (I-1)

Diphenyl sulfoxide (50 g) was dissolved in 800 ml of benzene, 200 g of aluminum chloride was added thereto and the reaction solution was refluxed for 24 hours. The reaction solution was gradually poured into 2 liters of water, 400 ml of a concentrated hydrochloric acid was added thereto and the solution was heated at 70° C. for 10 minutes. The aqueous solution was washed with 500 ml of ethyl acetate and filtered. Subsequently, 400 ml of water having dissolved therein 200 g of ammonium iodide was added to the filtrate.

The precipitated powder was filtered out, washed with water and then with ethyl acetate, and dried, thereby 70 g of triphenylsulfonium iodide was obtained.

The triphenylsulfonium iodide (30.5 g) was dissolved in 1,000 ml of methanol, 19.1 g of silver oxide was added to the solution, followed by stirring at room temperature for 4 hours. The solution was filtered, and a solution of an excess amount of the above-synthesized pentafluorobenzenesulfonic acid tetramethylammonium salt was added to the filtrate. The reaction solution was concentrated, dissolved in 500 ml of dichloromethane, and the solution was washed with a 5% aqueous solution of tetramethylammonium hydroxide and water. The organic phase was dried over anhydrous sodium sulfate and concentrated, thereby triphenylsulfonium pentafluorobenzenesulfonate was obtained.
Synthesis of Triarylsulfonium Pentafluorobenzenesulfonate Mixture of Exemplified Compounds (I-9) and (II-1)

Triarylsulfonium chloride (50 g) (manufactured by Fluka Co., a 50% aqueous solution of triphenylsulfonium chloride) was dissolved in 500 ml of water, and a solution of an excess amount of pentafluorobenzenesulfonic acid tetramethylammonium salt was added to this solution, thereby an oily substance was precipitated. The supernatant was removed by decantation, and the obtained oily substance was washed with water and dried, thereby triarylsulfonium pentafluorobenzenesulfonate (containing exemplified Compounds (I-9) and (II-1) as main components) was obtained.
Synthesis of Di(4-t-amylphenyl)iodonium Pentafluorobenzenesulfonate (Exemplified Compound (III-1))

t-Amylbenzene (60 g), 39.5 g of potassium iodate, 81 g of acetic anhydride, and 170 ml of dichloromethane were mixed, and 66.8 g of concentrated sulfuric acid was gradually dropwise added to the mixture with ice-cooling. After stirring the mixture with ice-cooling for 2 hours, the stirring was continued for 10 hours at room temperature. With ice-cooling, 500 ml of water was added to the reaction solution, followed by extraction with dichloromethane. The organic phase was washed with sodium bicarbonate and water and then concentrated, thereby a di(4-t-amylphenyl) iodonium sulfate was obtained. The sulfate was added to the solution of an excess amount of pentafluorobenzenesulfonic acid tetramethylammonium salt. Water (500 ml) was added to the solution, followed by extraction with dichloromethane. The organic phase was washed with a 5% aqueous solution of tetramethylammonium hydroxide and water, and then concentrated, thereby di(4-t-amylphenyl) iodonium pentafluorobenzenesulfonate was obtained.

Other compounds can also be synthesized according to similar methods.

Component (a) for use in the present invention is not limited to the above compounds which generate an acid by irradiation with electron beams or X-rays, and a photocationic polymerization photoinitiator, a photo-radical polymerization photoinitiator, a photo-decoloring agent of dyes, a photo-discoloring agent, well-known compounds used in a microresist which generate acids by irradiation with electron beams or X-rays and mixtures of these compounds can be arbitrarily used.

The following compounds can be used in the present invention as component (a), e.g., diazonium salts described in S. I. Schlesinger, *Photogr. Sci. Eng.*, 18, 387 (1974), and T. S. Bal et al., *Polymer*, 21, 423 (1980); ammonium salts described in U.S. Pat. Nos. 4,069,055, 4,069,056, Re 27,992, and Japanese Patent Application No. 3-140140; phosphonium salts described in D.C. Necker et al., *Macromolecules*, 17, 2468 (1984), C. S. Wen et al., *Teh, Proc. Conf. Rad. Curing ASIA*, p. 478, Tokyo, Oct. (1988), U.S. Pat. Nos. 4,069,055 and 4,069,056; iodonium salts described in J. V. Crivello et al., *Macromolecules*, 10 (6), 1307 (1977), *Chem. & Eng. News*, Nov. 28, p. 31 (1988), EP No. 104143, U.S. Pat. Nos. 339,049, 410,201, JP-A-2-150848 (the term "JP-A" as used herein means an "unexamined published Japanese patent application"), and JP-A-2-296514; sulfonium salts described in J. V. Crivello et al., *Polymer, J.* 17, 73 (1985), J. V. Crivello et al., *J. Org. Chem.*, 43, 3055 (1978), W. R. Watt et al., *J. Polymer Sci.*, Polymer Chem. Ed., 22, 1789 (1984), J. V. Crivello et al., *Polymer Bull.*, 14, 279 (1985), J. V. Crivello et al., *Macromolecules*, 14 (5), 1141 (1981), J. V. Crivello et al., *J. Polymer Sci.*, Polymer Chem. Ed., 17, 2877 (1977), EP Nos. 370693, 3902114, 233567, 297443, 297442, U.S. Pat. Nos. 4,933,377, 161,811, 410, 201, 339,049, 4,760,013, 4,734,444, 2,833,827, German Patents 2,904,626, 3,604,580 and 3,604,581; selenonium salts described in J. V. Crivello et al., *Macromolecules*, 10 (6), 1307 (1977), and J. V. Crivello et al., *J. Polymer Sci.*, Polymer Chem. Ed., 17, 1047 (1979); onium salts, such as arsonium salts described in C. S. Wen et al., *Teh, Proc. Conf. Rad. Curing ASIA*, p. 478, Tokyo, Oct. (1988); organic halogen compounds described in U.S. Pat. No. 3,905,815, JP-B-46-4605 (the term "JP-B" as used herein means an "examined Japanese patent publication"), JP-A-48-36281, JP-A-55-32070, JP-A-60-239736, JP-A-61-169835, JP-A-61-169837, JP-A-62-58241, JP-A-62-212401, JP-A-63-70243, and JP-A-63-298339; organic metals/organic halogen compounds described in K. Meier et al., *J. Rad. Curing*, 13 (4), 26 (1986), T. P. Gill et al., *Inorg. Chem.*, 19, 3007 (1980), D. Astruc, *Acc. Chem. Res.*, 19 (12), 377 (1896), and JP-A-2-161445; light-acid generating agents having an o-nitrobenzyl protective group described in S. Hayase et al., *J. Polymer Sci.*, 25, 753 (1987), E. Reichmanis et al., *J. Polymer Sci.*, Polymer Chem. Ed., 23, 1 (1985), Q. Q. Zhu et al., *J. Photochem.*, 36, 85, 39, 317 (1987), B. Amit et al., *Tetrahedron Lett.*, (24) 2205 (1973), D. H. R. Barton et al., *J. Chem. Soc.*, 3571 (1965), P. M. Collins et al., *J. Chem. Soc.*, Perkin I, 1695 (1975), M. Rudinstein et al., *Tetrahedron Lett.*, (17), 1445 (1975), J. W. Walker et al., *J. Am. Chem. Soc.*, 110, 7170 (1988), S. C. Busman et al., *J. Imaging Technol.*, 11 (4), 191 (1985), H. M. Houlihan et al., *Macromolecules*, 21, 2001 (1988), P. M. Collins et al., *J. Chem. Soc.*, Chem. Commun., 532 (1972), S. Hayase et al., *Macromolecules*, 18, 1799 (1985), E. Reichmanis et al., *J. Electrochem. Soc.*, Solid State Sci. Technol., 130 (6), F. M. Houlihan et al., *Macromolecules*, 21, 2001 (1988), EP Nos. 0290750, 046083, 156535, 271851, 0388343, U.S. Pat. Nos. 3,901,710, 4,181,531, JP-A-60-198538, and JP-A-53-133022; compounds which generate a sulfonic acid by photo-decomposition represented by iminosulfonate described in N. Tunooka et al., *Polymer Preprints, Japan*, 35 (8), G. Berner et al., *J. Rad. Curing*, 13 (4), W. J. Mijs et al., *Coating Technol.*, 55 (697), 45 (1983), Akzo, H. Adachi et al., *Polymer Preprints, Japan*, 37 (3), EP Nos. 0199672, 84515, 199672, 044115, 0101122, U.S. Pat. Nos. 618,564, 4,371,605, 4,431,774, JP-A-64-18143, JP-A-2-245756, and Japanese Patent Application No. 3-140109; and disulfone compounds described in JP-A-61-166544.

Further, compounds having introduced these groups or compounds generating an acid by irradiation with electron beams or X-rays into the polymer main chain or side chain can be used in the present invention, e.g., M. E. Woodhouse et al., *J. Am. Chem. Soc.*, 104, 5586 (1982), S. P. Pappas et al., *J. Imaging Sci.*, 30 (5), 218 (1986), S. Kondo et al., *Makromol. Chem.*, Rapid Commun., 9, 625 (1988), Y. Yamada et al., *Makromol. Chem.*, 152, 153, 163 (1972), J. V. Crivello et al., *J. Polymer Sci.*, Polymer Chem. Ed., 17, 3845 (1979), U.S. Pat. No. 3,849,137, German Patent 3,914,407, JP-A-63-26653, JP-A-55-164824, JP-A-62-69263, JP-A-63-146038, JP-A-63-163452, JP-A-62-153853, and JP-A-63-146029.

Further, the compounds which generate an acid by light as described, e.g., in V. N. R. Pillai, Synthesis, (1), 1 (1980), A. Abad et al., *Tetrahedron Lett.*, (47) 4555 (1971), D. H. R. Barton et al., *J. Chem. Soc.*, (C), 329 (1970), U.S. Pat. No. 3,779,778 and EP No. 126712 can also be used in the present invention.

Of the above compounds usable in combination with component (a) which are decomposed by electron beam or X-ray irradiation and generate an acid, those particularly effectively used in the present invention are described below.

(1) An oxazole derivative represented by formula (PAG1) substituted with a trihalomethyl group or an S-triazine derivative represented by formula (PAG2)

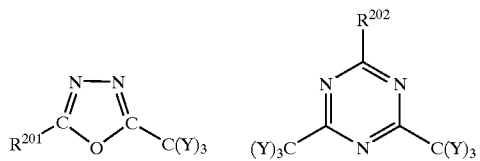

(PAG1)　　　(PAG2)

wherein $R^{201}$ represents a substituted or unsubstituted aryl group or alkenyl group; $R^{202}$ represents a substituted or unsubstituted aryl group, alkenyl group, alkyl group, or $-C(Y)_3$; and Y represents a chlorine or bromine atom.

Specific examples thereof are shown below but the present invention is not limited thereto.

(PAG1-1)

(PAG1-2)

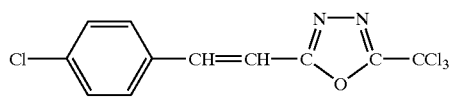

(PAG1-3)

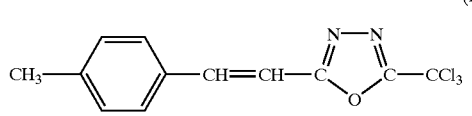

(PAG1-4)

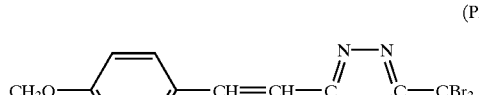

(PAG1-5)

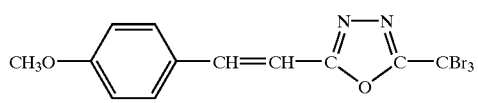

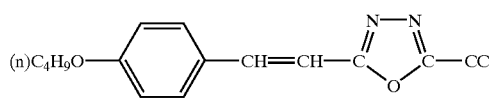

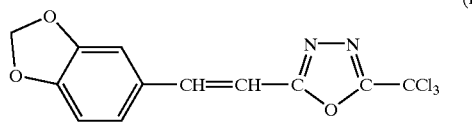

(PAG1-6)

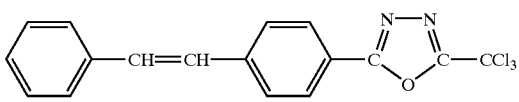

(PAG1-7)

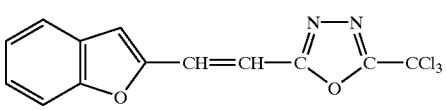

(PAG1-8)

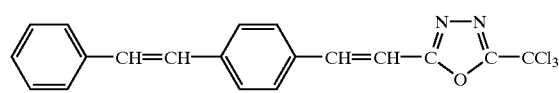

(PAG2-1)

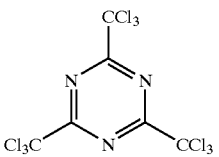

(PAG2-2)

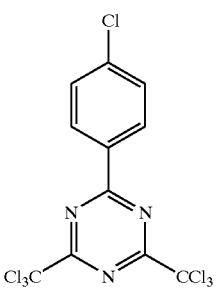

(PAG2-3)

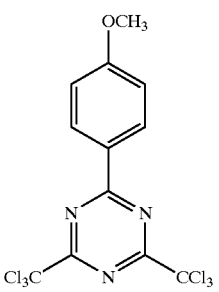

(PAG2-4)

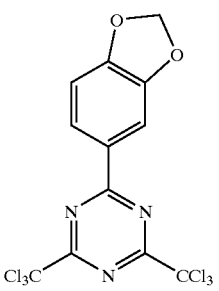

-continued (PAG2-5)
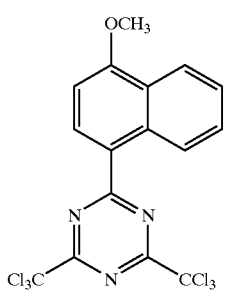

(PAG2-6)
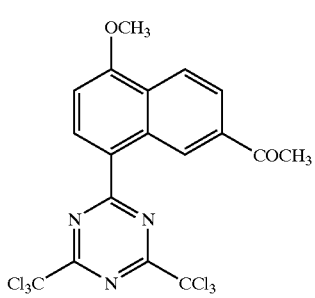

(PAG2-7)
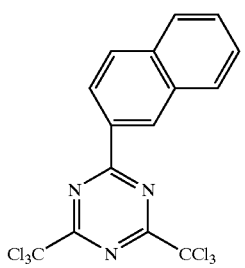

(PAG2-8)
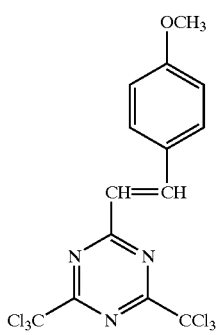

(PAG2-9)
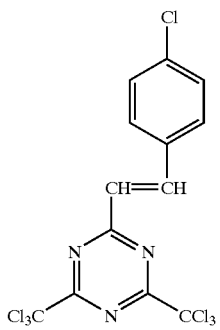

-continued (PAG2-10)
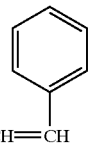

(2) A disulfone derivative represented by formula (PAG5) or an iminosulfonate derivative represented by formula (PAG6)

$$Ar^3—SO_2—SO_2—Ar^4 \quad (PAG5)$$

(PAG6)
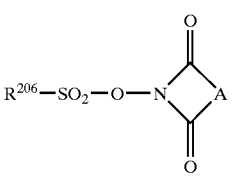

wherein $Ar^3$ and $Ar^4$ each represents a substituted or unsubstituted aryl group; $R^{206}$ represents a substituted or unsubstituted alkyl group or aryl group; and A represents a substituted or unsubstituted alkylene group, alkenylene group, or arylene group.

Specific examples thereof are shown below but the present invention is not limited thereto.

(PAG5-1)
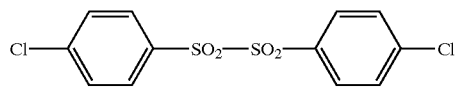

(PAG5-2)
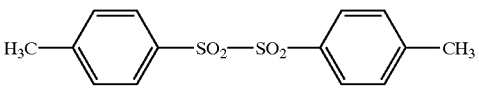

(PAG5-3)
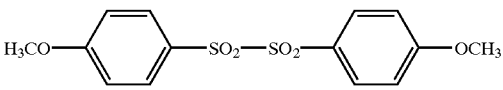

(PAG5-4)
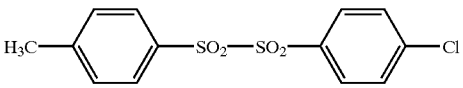

(PAG5-5)
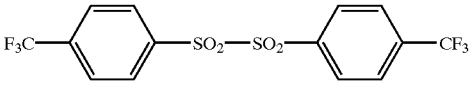

-continued
(PAG5-6)
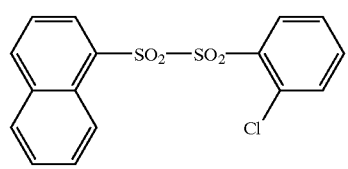
(PAG5-7)
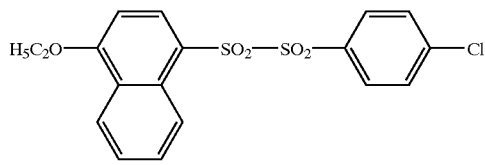
(PAG5-8)
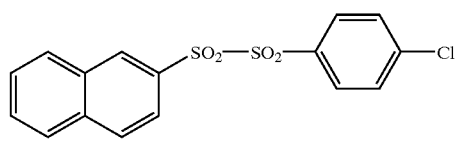
(PAG5-9)
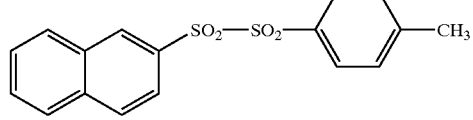
(PAG5-10)
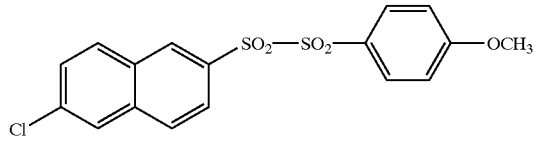
(PAG5-11)
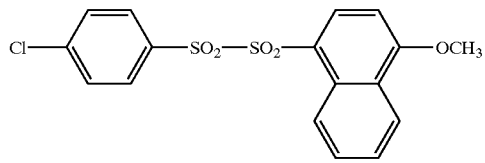
(PAG5-12)
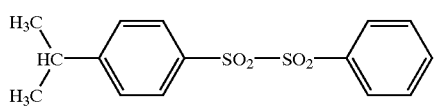
(PAG5-13)
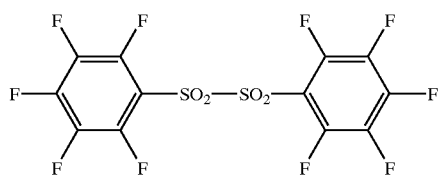
(PAG5-14)
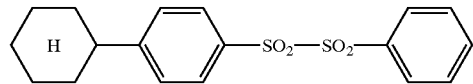
-continued
(PAG6-1)
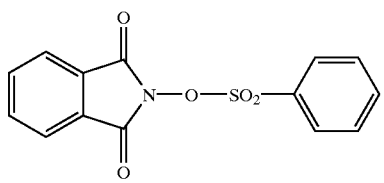
(PAG6-2)
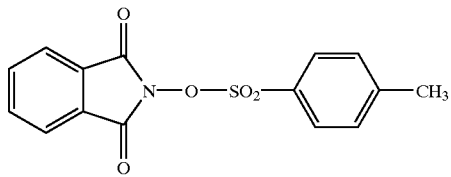
(PAG6-3)
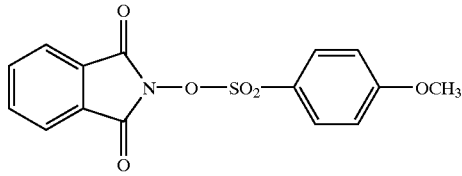
(PAG6-4)
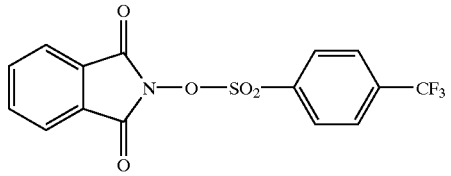
(PAG6-5)
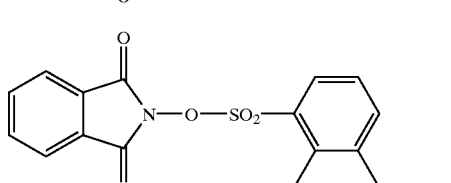
(PAG6-6)
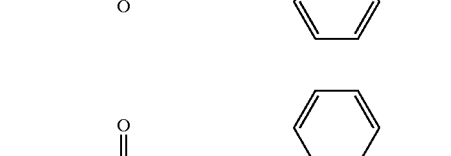
(PAG6-7)
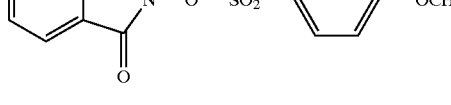
(PAG6-8)
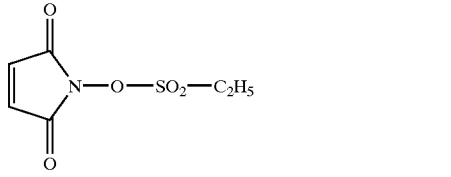
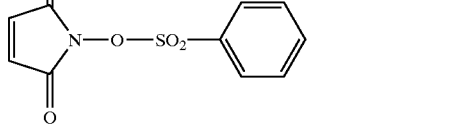

(PAG6-9)
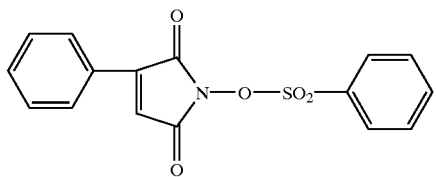

(PAG6-10)
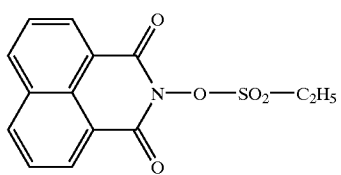

(PAG6-11)
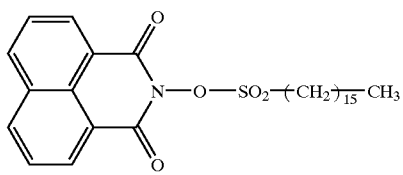

(PAG6-12)
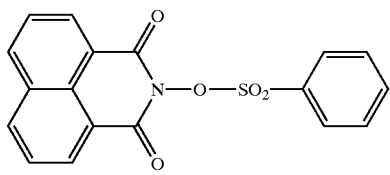

(PAG6-13)
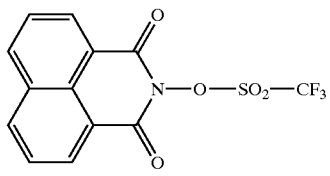

(PAG6-14)
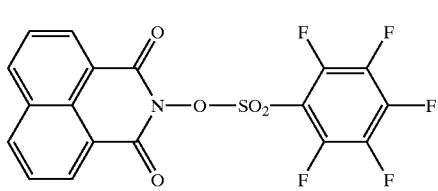

(PAG6-15)
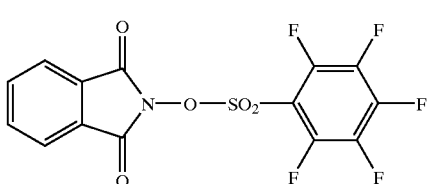

Component (a) may be used alone, or may be used in combination of two or more. The total amount of component (a) is generally from 0.1 to 20 wt %, preferably from 0.5 to 10 wt %, and more preferably from 1 to 7 wt %, based on the entire solid contents of the resist composition for electron beams or X-rays according to the present invention.

[II] Acid-decomposable Resin

The resin for use in the present invention is a resin having a leaving group containing a group derived from a compound having an ionization potential value (Ip value) smaller than the Ip value of p-ethylphenol, whose solubility in an alkali developer increases by the action of an acid.

An Ip value used herein indicates a value obtained by molecular orbital computation by MOPAC. Molecular orbital computation by MOPAC is computation by the technique described in James J. P. Stewart, *Journal of Computer-Aided Molecular Design*, Vol. 4, No. 1, pp. 1 to 105 (1990). Molecular orbital computation can be performed by using, e.g., CAChe (software of Oxford Molecular Co.). Further, PM3 parameter is preferably used in this computation.

The Ip value is preferably less than 8.9, more preferably 8.6 or less, and still more preferably 8.2 or less. The lower limit of Ip value is not particularly restricted but is preferably 2 or more, more preferably 3 or more, and still more preferably 4 or more.

In the present invention, the group derived from a compound having an Ip value smaller than the Ip value of p-ethylphenol is a group obtained by eliminating one hydrogen atom from the compound having an Ip value smaller than the Ip value of p-ethylphenol.

The resin for use in the present invention preferably has a repeating unit represented by formula (I) as the repeating unit having the above-described leaving group. In formula (I), $R^1$ represents a hydrogen atom or a methyl group; $R^2$ and $R^3$ each represents a hydrogen atom or an alkyl group having from 1 to 4 carbon atoms; W represents a divalent organic group; X represents an organic group, which satisfies that the Ip value of a compound represented by H—O—X is smaller than the Ip value of p-ethylphenol; and n represents an integer of from 1 to 4, preferably 1 or 2, and when n represents from 2 to 4, a plurality of W's may be the same or different.

The leaving group in formula (I) is equivalent to the group of from the carbon atom, to which $R^2$ is bonded in common with $R^3$, to X.

The divalent organic group represented by W stands for a single group or combination of two or more groups selected from the group consisting of an alkylene group, a cycloalkylene group, an ether group, a thioether group, a carbonyl group, an ester group, an amido group, a sulfonamido group, a urethane group, and a urea group.

As the alkylene group, the group represented by the following formula can be exemplified:

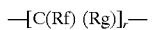

wherein Rf and Rg, which may be the same or different, each represents a hydrogen atom, an alkyl group, a substituted alkyl group, or an alkoxyl group. As the alkyl group, a lower alkyl group, e.g., methyl, ethyl, propyl, isopropyl or butyl, is preferred, and methyl, ethyl, propyl or isopropyl is more preferred. As the substituent of the substituted alkyl group, an alkoxyl group can be exemplified. As the alkoxyl group, an alkoxyl group having from 1 to 4 carbon atoms, e.g., methoxy, ethoxy, propoxy or butoxy, can be exemplified. r represents an integer of from 1 to 10.

As the cycloalkylene group, a cycloalkylene group having from 3 to 10 carbon atoms, e.g., cyclopentylene, cyclohexylene, and cyclooctylene, can be exemplified.

As the alkyl group having from 1 to 4 carbon atoms represented by $R^2$ and $R^3$, methyl, ethyl, propyl, n-butyl, isobutyl, s-butyl and t-butyl can be exemplified.

X in formula (I) is preferably represented by formula (II):

$$-L-Y \qquad (II)$$

wherein L represents an alkylene group, and Y represents a group selected from the following groups:

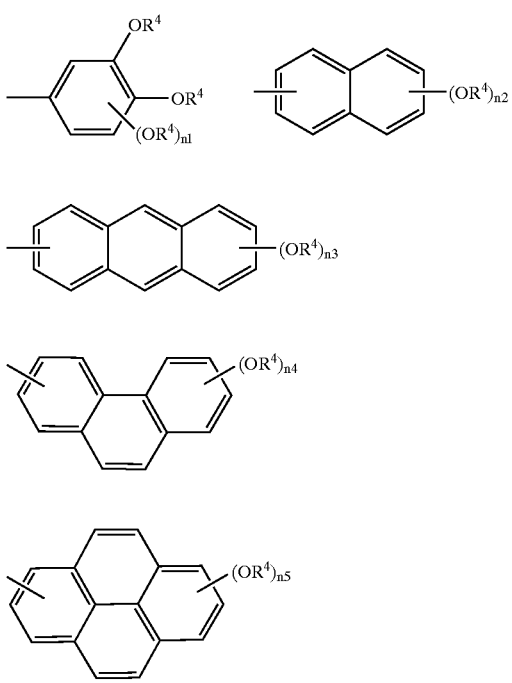

wherein $R^4$ represents a straight chain or branched alkyl group having from 1 to 6 carbon atoms.

As the alkylene group represented by L, a group represented by the following formula can be exemplified:

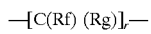

wherein Rf and Rg, which may be the same or different, each represents a hydrogen atom, an alkyl group, a substituted alkyl group, or an alkoxyl group. As the alkyl group, an alkyl group having from 1 to 4 carbon atoms, e.g., methyl, ethyl, propyl, isopropyl or butyl, is preferred, and methyl, ethyl, propyl or isopropyl is more preferred. As the substituent of the substituted alkyl group, an alkoxyl group (preferably having from 1 to 4 carbon atoms) can be exemplified. As the alkoxyl group, an alkoxyl group having from 1 to 4 carbon atoms, e.g., methoxy, ethoxy, propoxy or butoxy, can be exemplified. r represents an integer of from 1 to 10.

The examples of the straight chain or branched alkyl group having from 1 to 6 carbon atoms represented by $R^4$ include methyl, ethyl, propyl, butyl, pentyl and hexyl, which may have a substituent. The examples of the substituents include a halogen atom, an alkoxyl group, an alkoxycarbonyl group, an acyl group, and an acyloxy group, preferably having 10 or less carbon atoms.

As the monomers of repeating units having a leaving group, compounds having at least one addition polymerizable unsaturated bond selected from substituted styrenes represented by p-hydroxystyrene, m-hydroxystyrene, vinylbenzoic acid and styrene sulfonic acid, (meth)acrylic ester, (meth)acrylic amide, maleic anhydride, fumaric esters, maleimides, allyl compounds, vinyl ethers and vinyl esters, can be exemplified.

The monomer of the repeating unit having a leaving group of the present invention can be synthesized, e.g., by adding a vinyl ether having the leaving group to the side chain of the above monomer having an addition polymerizable unsaturated bond.

The specific examples of the repeating units having a leaving group for use in the present invention are shown below, but the present invention is not limited thereto.

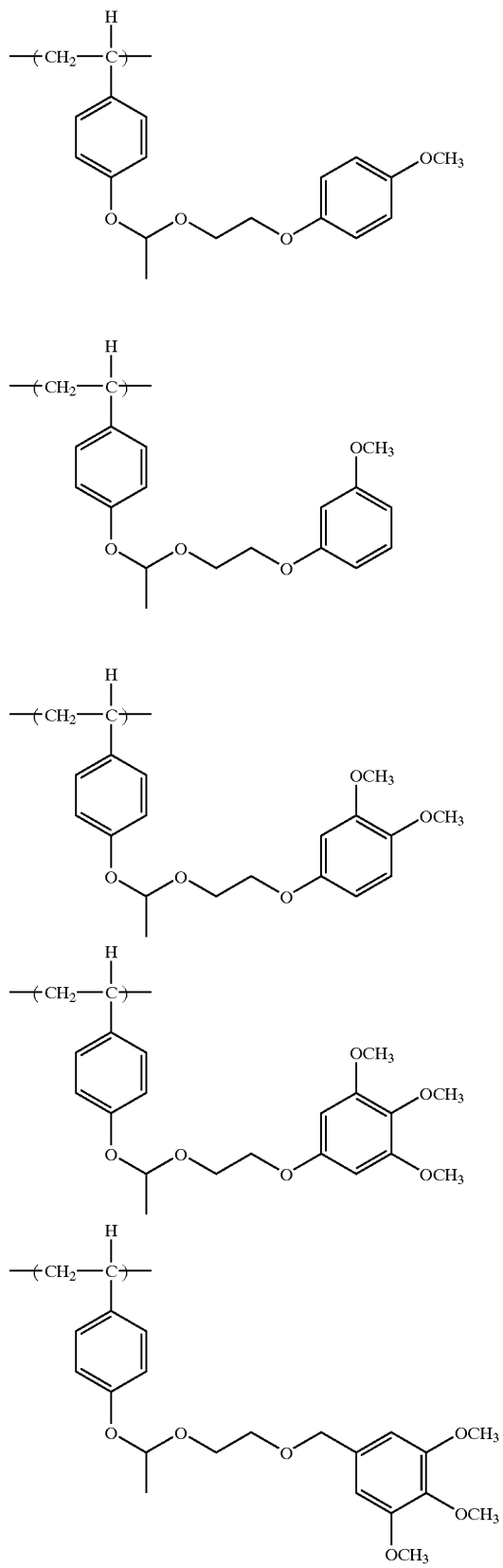

-continued
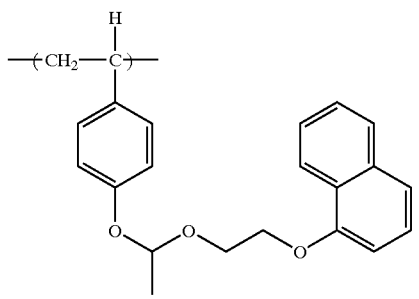
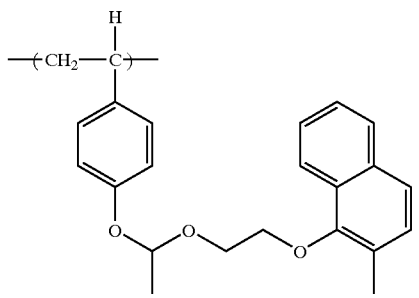
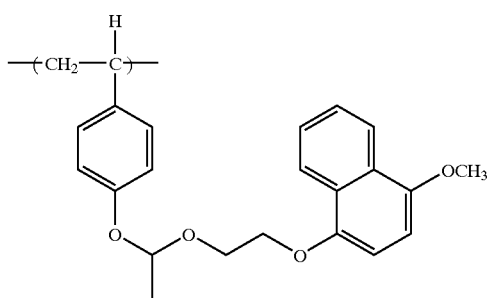
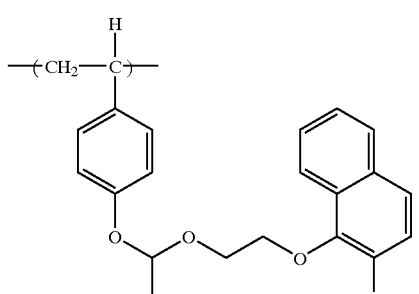
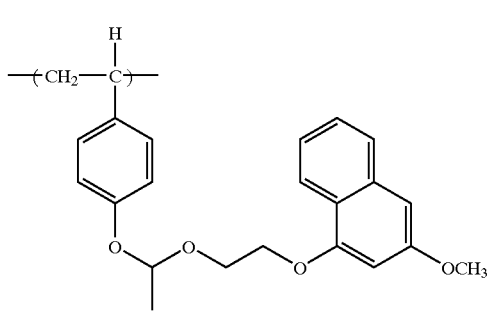
-continued
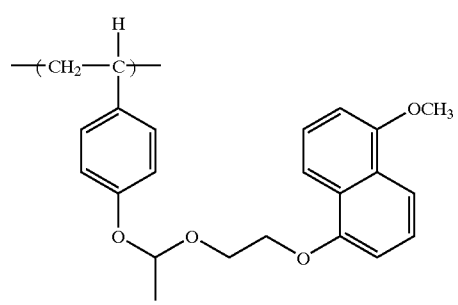
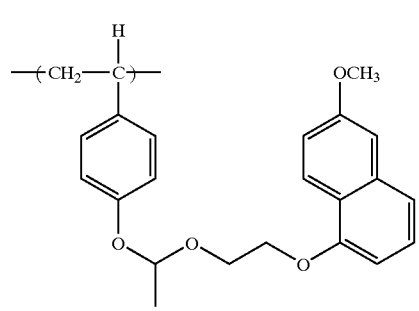
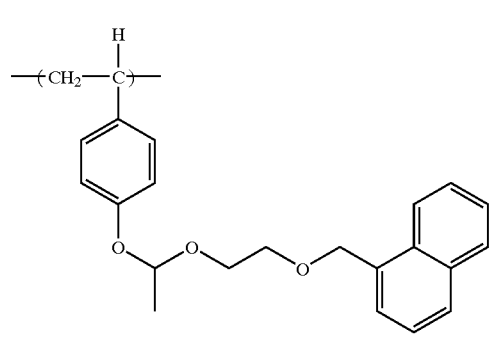
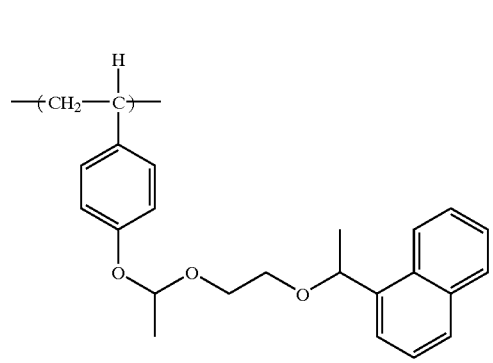
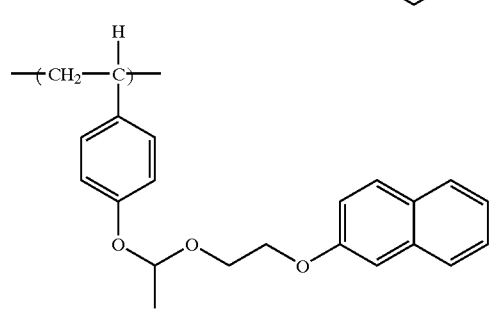

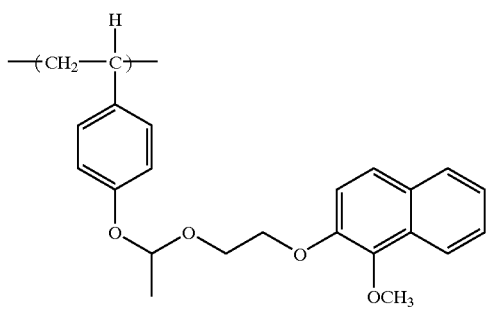
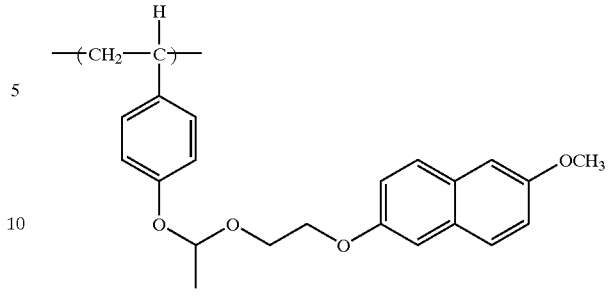
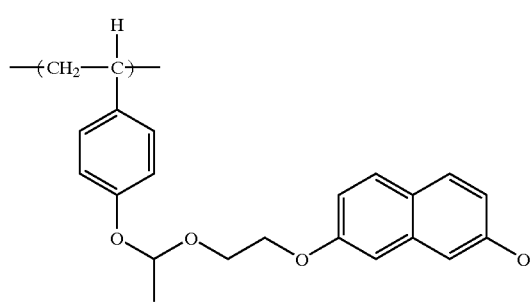
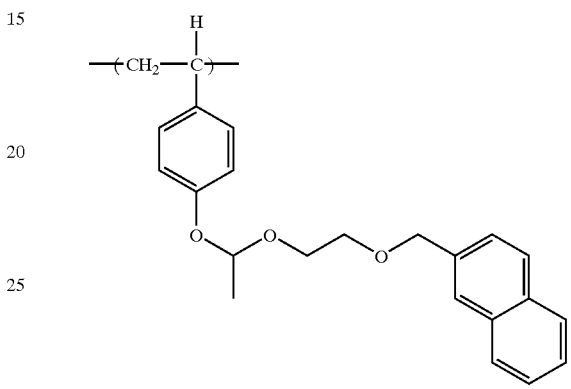
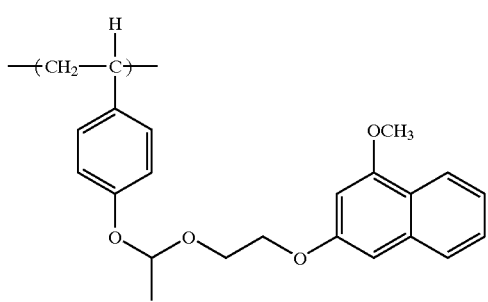
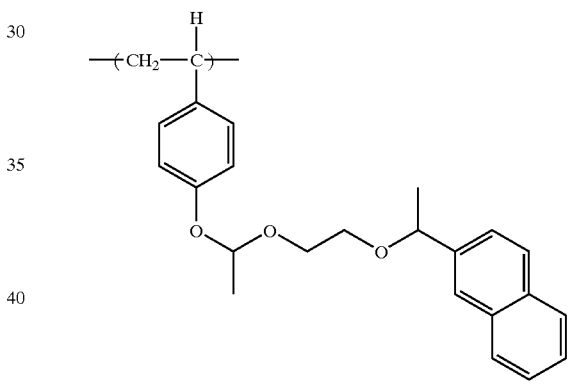
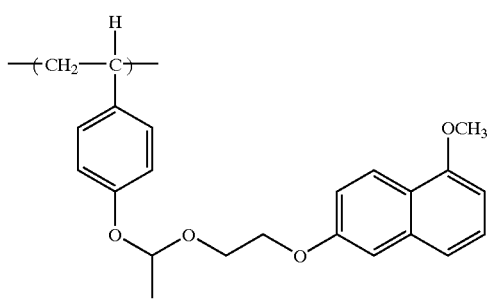
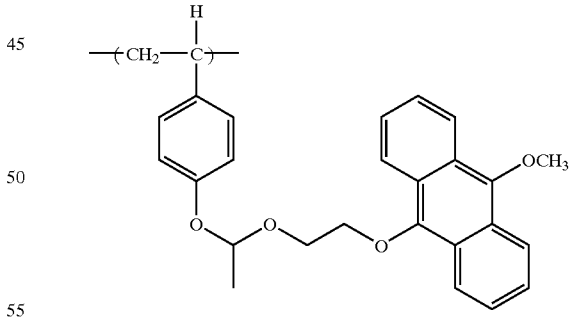
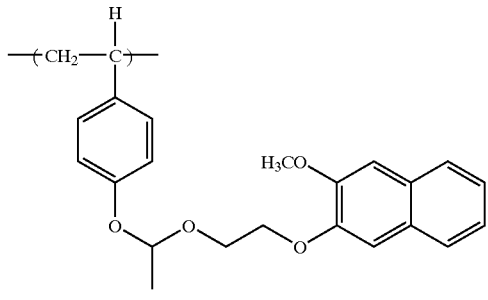
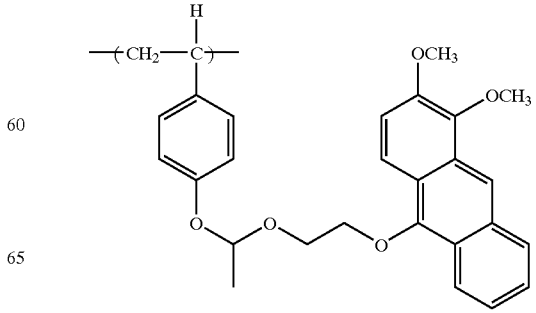

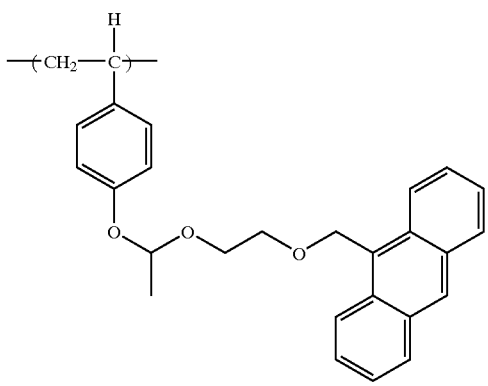
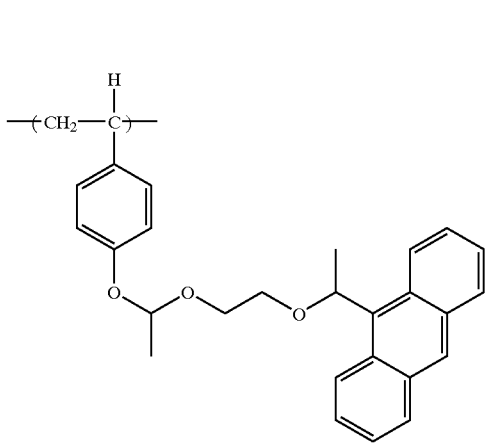
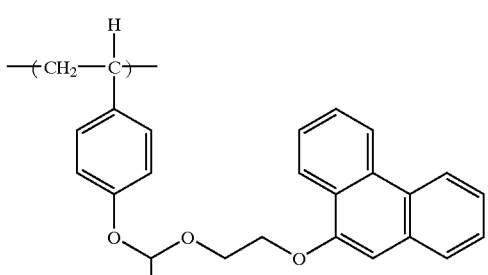
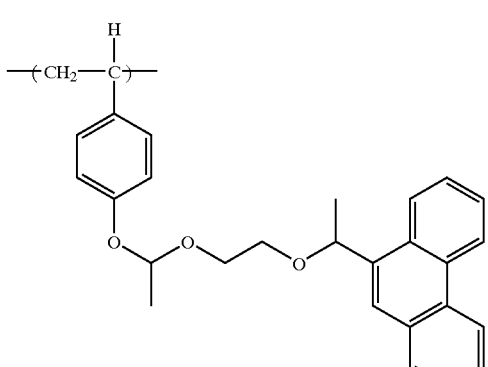

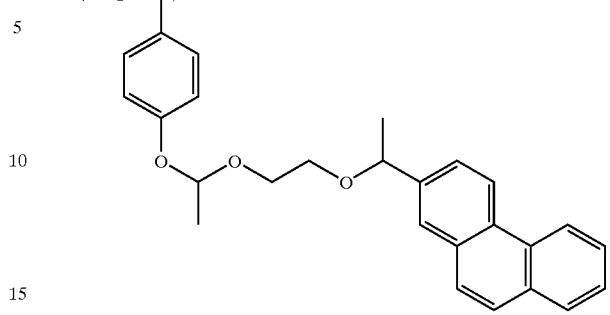
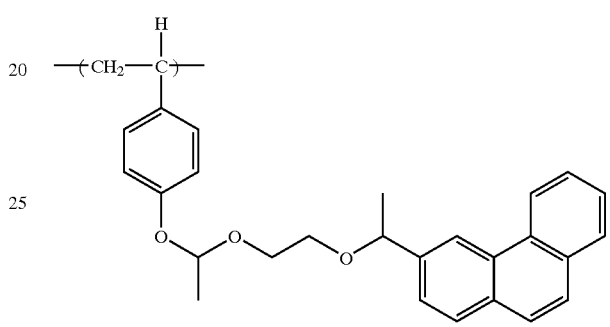
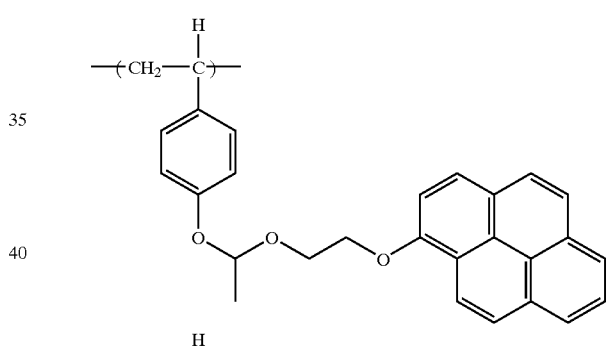
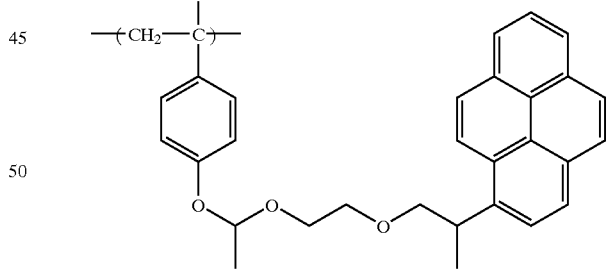

The acid-decomposable resin according to the present invention can be synthesized by polymerizing the monomer of the repeating unit having the specific leaving group of the present invention together with, as required, a monomer of a repeating unit having other leaving group (an acid-decomposable group) and a monomer not having an acid-decomposable group.

That is, the resist composition of the present invention can contain various repeating structural units for the purpose of adjusting a dry etching resistance, an aptitude to a standard developing solution, adhesion to a substrate, a resist profile, and the general characteristics required of the resist, e.g., a resolution, a heat resistance and sensitivity.

As such repeating structural units, the repeating structural units equivalent to the monomers shown below can be exemplified but the present invention is not limited thereto.

Due to containing these monomers, it becomes possible to finely adjust the characteristics required of acid-decomposable resins, in particular, the following characteristics.
(1) solubility in a coating solvent,
(2) film-forming property (glass transition point),
(3) alkali developability,
(4) film decrease (hydrophilicity/hydrophobicity, selection of alkali-soluble groups),
(5) adhesion to the substrate of an unexposed domain, and
(6) dry etching resistance.

As such monomers, compounds having one addition polymerizable unsaturated bond selected from, e.g., acrylicesters, methacrylic esters, acrylamides, methacrylamides, allyl compounds, vinyl ethers and vinyl esters can be exemplified.

Specifically, the following monomers can be exemplified.
Acrylic Esters (preferably alkyl acrylate, wherein the alkyl group has from 1 to 10 the Carbon Atoms):
methyl acrylate, ethyl acrylate, propyl acrylate, amyl acrylate, cyclohexyl acrylate, ethylhexyl acrylate, octyl acrylate, t-octyl acrylate, chloroethyl acrylate, 2-hydroxyethyl acrylate, 2,2-dimethylhydroxypropyl acrylate, 5-hydroxypentyl acrylate, trimethylolpropane monoacrylate, pentaerythritol monoacrylate, benzyl acrylate, methoxybenzyl acrylate, furfuryl acrylate, and tetrahydrofurfuryl acrylate.
Methacrylic Esters (preferably alkyl methacrylate, wherein the alkyl group has from 1 to 10 the Carbon Atoms):
methyl methacrylate, ethyl methacrylate, propyl methacrylate, isopropyl methacrylate, amyl methacrylate, hexyl methacrylate, cyclohexyl methacrylate, benzyl methacrylate, chlorobenzyl methacrylate, octyl methacrylate, 2-hydroxyethyl methacrylate, 4-hydroxybutyl methacrylate, 5-hydroxypentyl methacrylate, 2,2-dimethyl-3-hydroxypropyl methacrylate, trimethylolpropane monomethacrylate, pentaerythritol monomethacrylate, furfuryl methacrylate, and tetrahydrofurfuryl methacrylate.
Acrylamides:
acrylamide, N-alkylacrylamide (as the alkyl group, an alkyl group having from 1 to 10 carbon atoms, e.g., methyl, ethyl, propyl, butyl, t-butyl, heptyl, octyl, cyclohexyl, hydroxyethyl), N,N-dialkylacrylamide (as the alkyl group, an alkyl group having from 1 to 10 carbon atoms, e.g., methyl, ethyl, butyl, isobutyl, ethylhexyl, cyclohexyl), N-hydroxyethyl-N-methylacrylamide, and N-2-acetamidoethyl-N-acetylacrylamide.
Methacrylamides:
methacrylamide, N-alkylmethacrylamide (as the alkyl group, an alkyl group having from 1 to 10 carbon atoms, e.g., methyl, ethyl, t-butyl, ethylhexyl, hydroxyethyl, cyclohexyl), N,N-dialkylmethacrylamide (as the alkyl group, e.g., ethyl, propyl, butyl), and N-hydroxyethyl-N-methylmethacrylamide.
Allyl Compounds:
allyl esters (e.g., allyl acetate, allyl caproate, allyl caprylate, allyl laurate, allyl palmitate, allyl stearate, allyl benzoate, allyl acetoacetate, allyl lactate), and allyloxyethanol.
Vinyl Ethers:
alkyl vinyl ether, e.g., hexyl vinyl ether, octyl vinyl ether, decyl vinyl ether, ethylhexyl vinyl ether, methoxyethyl vinyl ether, ethoxyethyl vinyl ether, chloroethyl vinyl ether, 1-methyl-2,2-dimethylpropyl vinyl ether, 2-ethylbutyl vinyl ether, hydroxyethyl vinyl ether, diethylene glycol vinyl ether, dimethylaminoethyl vinyl ether, diethylaminoethyl vinyl ether, butylaminoethyl vinyl ether, benzyl vinyl ether, and tetrahydrofurfuryl vinyl ether.
Vinyl Esters:
vinyl butyrate, vinyl isobutyrate, vinyl trimethyl acetate, vinyl diethyl acetate, vinyl valerate, vinyl caproate, vinyl chloroacetate, vinyl dichloroacetate, vinyl methoxy acetate, vinyl butoxy acetate, vinyl acetoacetate, vinyl lactate, vinyl-β-phenylbutyrate, and vinyl cyclohexylcarboxylate.
Dialkyl Itaconates:
dimethyl itaconate, diethyl itaconate, and dibutyl itaconate.
Dialkyl Esters or Monoalkyl Esters of Fumaric Acid:
dibutyl fumarate.
Others:
crotonic acid, itaconic acid, acrylonitrile, methacrylonitrile, and maleylonitrile.

Besides the above compounds, addition polymerizable unsaturated compounds copolymerizable with the monomers equivalent to the above various repeating structural units can be used.

In acid-decomposable resins, the molar ratio of the content of each repeating structural unit is arbitrarily set up for adjusting the dry etching resistance of a resist, an aptitude to a standard developing solution, adhesion to a substrate, a resist profile, and the general requisites of the resist, e.g., resolution, a heat resistance and sensitivity.

Acid-decomposable resins for use in the present invention can be synthesized by well-known methods such as radical polymerization, cationic polymerization and anionic polymerization. It is most easy to perform radical polymerization by combining equivalent monomers, but some monomers can be more preferably synthesized in case of utilizing cationic polymerization and anionic polymerization. When monomers cause a reaction other than a polymerization reaction according to polymerization initiation seeds, desired polymers can be obtained by polymerizing monomer having incorporated therein appropriate protective groups and releasing the protective groups after polymerization. With respect to polymerization, *Jikken Kagaku Koza* 28, *Kobunshi Gosei and Shin Jikken Kagaku Koza* 19, *Kobunshi Kagaku* [I] can be referred to.

The content of the repeating unit monomer having a leaving group of the present invention in the acid-decomposable resin is generally from 5 to 40 mol %, preferably from 10 to 25 mol %.

The acid-decomposable resin according to the present invention has a molecular weight of greater than 3,000 and 1,000,000 or less, preferably weight average molecular weight of greater than 3,000 and 500,000 or less, and more preferably weight average molecular weight of greater than 3,000 and 100,000 or less.

The molecular weight distribution (Mw/Mn) of the acid-decomposable resins which can be synthesized by the above synthesis methods is preferably from 1.0 to 1.5. In particular, the sensitivity of resist can be heightened by the above range of molecular weight distribution. Resins having such molecular weight distribution can be synthesized by utilizing living anionic polymerization.

[III] Solvent

The above-described components of the composition of the present invention are dissolved in a solvent and coated on a substrate. The examples of the solvents preferably used in the present invention include ethylene dichloride, cyclohexanone, cyclopentanone, 2-heptanone, γ-butyrolactone, methyl ethyl ketone, ethylene glycol monomethyl ether, ethylene glycol monoethyl ether, 2-methoxyethyl acetate, ethylene glycol monoethyl ether acetate, propylene glycol monomethyl ether, propylene glycol monomethyl ether acetate, propylene glycol monomethyl ether propionate, toluene, ethyl acetate, methyl lactate, ethyl lactate, methylmethoxy propionate, ethylethoxy propionate, methyl pyruvate, ethyl pyruvate, propyl pyruvate, N,N-dimethylformamide, dimethyl sulfoxide, N-methylpyrrolidone and tetrahydrofuran. These solvents can be used alone or in combination of two or more.

Propylene glycol monomethyl ether acetate (PGMEA) is particularly preferably used in the present invention, by which excellent in-plane uniformity can be obtained. In this case, the content of PGMEA in the composition of the present invention is preferably 10 wt % or more, more preferably 20 wt % or more, based on the total weight of a solvent.

The composition of the present invention is dissolved in a solvent so that the concentration of the solid contents of the composition (including other additives described later) falls within the range of generally from 0.5 to 20 wt %, preferably from 3 to 15 wt %.

[IV] Organic Basic Compound

The organic basic compound for use in the present invention is a compound having a stronger basicity than phenol. A nitrogen-containing basic compound is preferably used as the organic basic compound.

The nitrogen-containing basic compounds including the structures represented by the following formulae (A) to (E) are especially preferred.

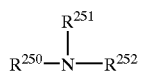

(A)

wherein $R^{250}$, $R^{251}$ and $^{252}$, which may be the same or different, each represents a hydrogen atom, an alkyl group having from 1 to 6 carbon atoms, an alkylamino group having from 1 to 6 carbon atoms, a hydroxylalkyl group having from 1 to 6 carbon atoms, or a substituted or unsubstituted aryl group having from 6 to 20 carbon atoms, and $R^{251}$ and $^{252}$ may be bonded to each other to form a ring.

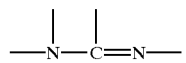 (B)

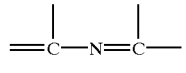 (C)

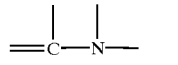 (D)

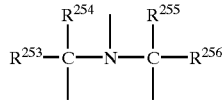 (E)

wherein $R^{253}$, $R^{254}$, $R^{255}$ and $R^{256}$, which may be the same or different, each represents an alkyl group having from 1 to 6 carbon atoms.

More preferred compounds are nitrogen-containing basic compounds having 2 or more nitrogen atoms of different chemical environments in one molecule, and particularly preferred compounds are compounds containing both a substituted or unsubstituted amino group and the ring structure containing a nitrogen atom, or compounds having an alkylamino group. The specific examples of preferred compounds include a substituted or unsubstituted guanidine, a substituted or unsubstituted aminopyridine, a substituted or unsubstituted aminoalkylpyridine, a substituted or unsubstituted aminopyrrolidine, a substituted or unsubstituted indazole, a substituted or unsubstituted pyrazole, a substituted or unsubstituted pyrazine, a substituted or unsubstituted pyrimidine, a substituted or unsubstituted purine, a substituted or unsubstituted imidazoline, a substituted or unsubstituted pyrazoline, a substituted or unsubstituted piperazine, a substituted or unsubstituted aminomorpholine, and a substituted or unsubstituted aminoalkylmorpholine. The examples of the preferred substituents include an amino group, an aminoalkyl group, an alkylamino group, an aminoaryl group, an arylamino group, an alkyl group, an alkoxyl group, an acyl group, an acyloxy group, an aryl group, an aryloxy group, a nitro group, a hydroxyl group and a cyano group.

The examples of particularly preferred compounds include guanidine, 1,1-dimethylguanidine, 1,1,3,3-tetramethylguanidine, imidazole, 2-methylimidazole, 4-methylimidazole, N-methylimidazole, 2-phenylimidazole, 4,5-diphenylimidazole, 2,4,5-triphenylimidazole, 2-aminopyridine, 3-aminopyridine, 4-aminopyridine, 2-dimethylaminopyridine, 4-dimethylaminopyridine, 2-diethylaminopyridine , 2-(amino-methyl)pyridine, 2-amino-3-methylpyridine, 2-amino-4-methyl-pyridine, 2-amino-5-methylpyridine, 2-amino-6-methylpyridine, 3-aminoethylpyridine, 4-aminoethylpyridine, 3-aminopyrrolidine, piperazine, N-(2-aminoethyl) piperazine, N-(2-aminoethyl)piperidine, 4-amino-2,2,6,6-tetramethylpiperidine, 4-piperidinopiperidine, 2-iminopiperidine, 1-(2-aminoethyl)pyrrolidine, pyrazole, 3-amino-5-methylpyrazole, 5-amino-3-methyl-1-p-tolylpyrazole, pyrazine, 2-(aminomethyl)-5-methylpyrazine, pyrimidine, 2,4-diaminopyrimidine, 4,6-dihydroxypyrimidine, 2-pyrazoline, 3-pyrazoline, N-aminomorpholine, N-(2-aminoethyl)morpholine, diazabicyclononene, and diazabicycloundecene, but the present invention is not limited thereto.

These nitrogen-containing basic compounds can be used alone or in combination of two or more. The addition amount of the nitrogen-containing basic compound is generally from 0.01 to 10 mol % of (a) a compound which generates an acid by irradiation with electron beams or X-rays according to the present invention, preferably from 0.1 to 5 mol %. When the amount is less than 0.01 mol %, the effect of addition of the nitrogen-containing basic compound cannot be obtained. On the other hand, when it exceeds 10 mol %, the resist is accompanied by the reduction of sensitivity and the deterioration of the developing properties of unexposed area.

[V] Surfactant containing at least one of a Fluorine Atom and a Silicon Atom

Fluorine- and/or silicon-containing surfactants are preferably used in the present invention. The positive photoresist composition of the present invention can contain any one, or two or more, of a fluorine-containing surfactant, a silicon-containing surfactant, and a surfactant containing both a fluorine atom and a silicon atom.

These surfactants are disclosed, e.g., in JP-A-62-36663, JP-A-61-226746, JP-A-61-226745, JP-A-62-170950, JP-A-63-34540, JP-A-7-230165, JP-A-8-62834, JP-A-9-54432, JP-A-9-5988, U.S. Pat. Nos. 5,405,720, 5,360,692, 5,529, 881, 5,296,330, 5,436,098, 5,576,143, 5,294,511, and 5,824, 451. The following described commercially available surfactants can also be used as they are.

The examples of commercially available surfactants include fluorine-containing surfactants and silicon-containing surfactants, e.g., Eftop EF301 and EF303 (manufactured by Shin-Akita Chemical Co., Ltd.), Florad FC430 and FC431 (manufactured by Sumitomo 3M Co., Limited), Megafac F171, F173, F176, F189 and R08 (manufactured by Dainippon Ink & Chemicals, Co., Ltd.), Surflon S-382, SC101, SC102, SC103, SC104, SC105 and SC106 (manufactured by Asahi Glass Co., Ltd.), and Troysol S-366 (manufactured by Troy Chemical Industries Inc.). Polysiloxane polymer KP-341 (manufactured by Shin-Etsu Chemical Industry Co., Ltd.) can also be used as the silicon-based surfactant.

Surfactants other than fluorine-containing and/or silicon-containing surfactants can be used in the present invention. The specific examples of these surfactants include nonionic surfactants such as polyoxyethylene alkyl ethers (e.g., polyoxyethylene lauryl ether, polyoxyethylene stearyl ether, polyoxyethylene cetyl ether, and polyoxyethylene oleyl ether), polyoxyethylene alkylaryl ethers (e.g., polyoxyethylene octylphenol ether and polyoxyethylene nonylphenol ether), polyoxyethylene-polyoxypropylene block copolymers, sorbitan fatty acid esters (e.g., sorbitan monolaurate, sorbitan monopalmitate, sorbitan monostearate, sorbitan monooleate, sorbitan trioleate, and sorbitan tristearate), and polyoxyethylene sorbitan fatty acid esters (e.g., polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate); acrylic acid or methacrylic acid (co)polymers Polyflow No. 75 and No. 95 (Kyoei-Sha Oils and Fats Chemical Industries Co., Ltd.).

The content of surfactants is generally 0.001 to 2 wt %, based on the solid contents of the entire composition in the resist composition of the present invention, preferably 0.01 to 1 wt %.

These surfactants may be used alone or may be used in combination of two or more.

To search for further progress of the semiconductor, in addition to essential performance of the resist, such as high resolution, compositions having high performances come to be required from various viewpoints, such as sensitivity, a coating property, a required minimum coating amount, an adhering property to a substrate, heat resistance, and the storage stability of composition.

A tendency to use a big size wafer to make a device is seen lately to increase the absolute amount of finished chips to be obtained.

However, when a big size wafer is coated, since there is some fear of the reduction of a coating property, in particular, the in-plane uniformity of film thickness, the improvement of the in-plane uniformity of film thickness of a big size wafer is required. The uniformity can be confirmed by measuring the film thickness of a water at many points in the wafer, taking the standard deviation of the measured values, and multiplying the standard deviation by 3. It can be said that the smaller the value, the higher is the in-plane uniformity. The value obtained by multiplying the standard deviation by 3 is preferably 100 or less, more preferably 50 or less.

Further, CD linearity is regarded as most important also in the production of a mask for photo-lithography, and the improvement of the in-plane uniformity of film thickness in blanks is required.

The resist composition of the present invention can be filtered after being dissolved in a solvent. The filter for use for this purpose is selected from among those used in the field of the resist, specifically materials containing polyethylene, nylon or polysulfone are used as the filter.

More specifically, Microgard, Microgard Plus, Microgard Minichem-D, Microgard Minichem-D PR, Millipore Optimizer DEV/DEV-C and Millipore Optimizer 16/14 (manufactured by MILLIPORE Co.), and Ultibore N66, Posidyne and Nylon Falcon (manufactured by Pole Co.) can be exemplified. The pore diameters of filters confirmed by the following method can be used. That is, PSL standard particles (polystyrene latex beads having a particle diameter of 0.100 $\mu$m) are dispersed in super pure water, continuously flowed with a tube pump to the primary side of the filter at a constant flow rate, and challenge concentration was measured by a particle counter. Those capable of capturing 90% or more of the particles can be used as filters having a pore diameter of 0.1 $\mu$m.

After coating the positive electron beam or X-ray resist composition of the present invention on such a substrate as used in the production of precise integrated circuit elements (e.g., a silicon/silicon dioxide-coated substrate) or on a substrate as used in the production of masks for photo-lithography (e.g., glass/Cr-coated substrate) by an appropriate coating method with a spinner or a coater, the coated substrate is subjected to exposure through a predetermined mask, baking and development, thereby a good resist pattern can be obtained.

The developing solution for the composition of the present invention include alkaline aqueous solutions of inorganic alkalis such as sodium hydroxide, potassium hydroxide, sodium carbonate, sodium silicate, sodium metasilicate, and aqueous ammonia; primary amines such as ethylamine and n-propylamine; secondary amines such as diethylamine and di-n-butylamine; tertiary amines such as triethylamine and methyldiethylamine; alcohol amines such as dimethyl ethanolamine and triethanolamine; quaternary ammonium salts such as tetramethylammonium hydroxide and tetraethylammonium hydroxide; and cyclic amines such as pyrrole and piperidine.

The above alkaline aqueous solutions can further contain appropriate amounts of alcohols and surfactants.

EXAMPLE

The present invention is explained in more detail with reference to the following examples, but the present invention should not be construed as being limited thereto.

1. Synthesis Examples of Constituting Materials (1) Compound which generates acid by irradiation with electron beams or X-rays (1-1) Synthesis of pentafluorobenzenesulfonic acid tetramethylammonium salt Pentafluorobenzenesulfonyl chloride (25 g) was dissolved in 100 ml of methanol with ice-cooling, and 100 g of a 25% aqueous solution of tetramethylammonium hydroxide was gently added to the solution. The reaction solution was stirred at room temperature for 3 hours, thereby a solution of pentafluorobenzenesulfonic acid tetramethylammonium salt was obtained. This solution was used for salt exchange with a sulfonium salt and an iodonium salt.

(1-2) Synthesis of triphenylsulfonium pentafluorobenzene-sulfonate

Diphenyl sulfoxide (50 g) was dissolved in 800 ml of benzene, 200 g of aluminum chloride was added to the above solution and the solution was refluxed for 24 hours. The reaction solution was gently poured into 2 liters of ice, 400 ml of a concentrated hydrochloric acid was added thereto, and the reaction solution was heated at 70° C. for 10 minutes. This aqueous solution was washed with 500 ml of ethyl acetate and filtered. Subsequently, 400 ml of water having dissolved therein 200 g of ammonium iodide was added to the filtrate. The precipitated powder was filtered out, washed with water and then with ethyl acetate, and dried, thereby 70 g of triphenylsulfonium iodide was obtained.

The triphenylsulfonium iodide (30.5 g) was dissolved in 1,000 ml of methanol, 19.1 g of silver oxide was added to the solution, followed by stirring at room temperature for 4 hours. The solution was filtered, and a solution of an excess amount of the above pentafluorobenzenesulfonic acid tetramethylammonium salt was added to the filtrate. The reaction solution was concentrated, dissolved in 500 ml of dichloromethane, and the solution was washed with a 5% aqueous solution of tetramethylammonium hydroxide and water. The organic phase was dried over anhydrous sodium sulfate and concentrated, thereby triphenylsulfonium pentafluorobenzenesulfonate (I-1) was obtained.

(1-3) Synthesis of di(4-t-amylphenyl)iodonium pentafluorobenzenesulfonate t-Amylbenzene (60 g), 39.5 g of potassium iodate, 81 g of acetic anhydride, and 170 ml of dichloromethane were mixed, and 66.8 g of concentrated sulfuric acid was gradually dropwise added to the mixture with ice-cooling. After stirring the mixture with ice-cooling for 2 hours, the stirring was continued for 10 hours at room temperature. With ice-cooling, 500 ml of water was added to the reaction solution, followed by extraction with dichloromethane. The organic phase was washed with sodium bicarbonate and water and then concentrated, thereby a di(4-t-amylphenyl) iodonium sulfate was obtained. The sulfate was added to the solution of an excess amount of pentafluorobenzenesulfonic acid tetramethylammonium salt. Water (500 ml) was added to the solution, followed by extraction with dichloromethane. The organic phase was washed with a 5% aqueous solution of tetramethylammonium hydroxide and water and then concentrated, thereby di(4-t-amylphenyl) iodonium pentafluorobenzenesulfonate (III-1) was obtained.

Other acid generating agents can also be synthesized according to similar methods.

(2) Synthesis of Resin

Synthesis Example 1

Synthesis of vinyl ether 1

4-Methoxy-1-naphthol (25 g) and 22.9 g of chloroethyl vinyl ether were dissolved in 140 ml of DMAc, 6.90 g of NaOH was added to the solution, and the solution was stirred at 120° C. for 2 hours. Thereafter NaCl salt was filtered, ethyl acetate and water were added thereto, and the solution was separated. Ethyl acetate was then distilled off from the organic phase, followed by recrystallization with methanol, thereby vinyl ether 1 was obtained. The yield was 84%.

Synthesis Examples 2 to 14

Synthesis of vinyl ethers 2 to 14

The reactions were performed in the same manner as in Synthesis Example 1, except for changing the alcohols to be added, and vinyl ethers 2 to 14 were obtained by silica gel column chromatography or recrystallization with methanol.

Synthesis Example 15

Synthesis of vinyl ether 15

In a dried flask, 25 g of 9-hydroxymethyl anthracene was 100 ml of anhydrous THF, and the solution was cooled at 0° C. under a nitrogen gas current. Sodium hydride (3.17 g) was added to the solution and the solution was stirred for a while. Thereafter 19.2 g of chloroethyl vinyl ether was dropwise added to the solution with maintaining the temperature at 0° C. After termination of the dropwise addition, the solution was stirred at room temperature for 2 hours. After adding a saturated ammonium chloride aqueous solution, ethyl acetate and water were added thereto, and the solution was separated. The solvent was then distilled off from the organic phase, and the reaction solution was purified by silica gel column chromatography, thereby vinyl ether 15 was obtained. The yield was 88%.

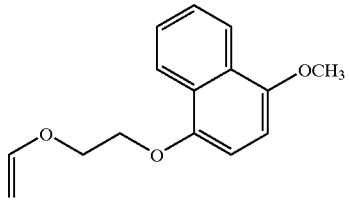

Vinyl Ether 1

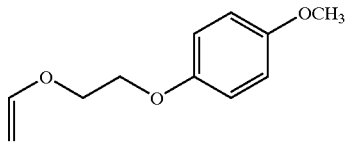

Vinyl Ether 2

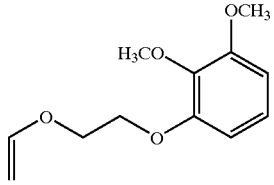

Vinyl Ether 3

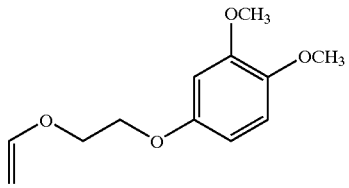

Vinyl Ether 4

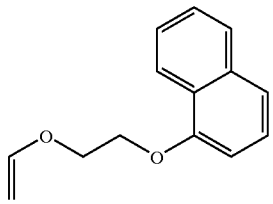

Vinyl Ether 5

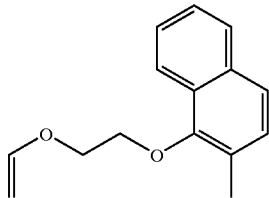

Vinyl Ether 6

Vinyl Ether 7

Vinyl Ether 8

Vinyl Ether 9

Vinyl Ether 10

Vinyl Ether 11

Vinyl Ether 12

Vinyl Ether 13

Vinyl Ether 14

Vinyl Ether 15

Synthesis Example 16

Synthesis of resin 1

Fifty (50) grams of poly(p-hydroxystyrene) (VP-8000, manufactured by Nippon Soda Co., Ltd.) was dissolved in 200 g of anhydrous THF. Compound 1 (15.25 g) and 80 mg of p-toluenesulfonic acid were added thereto, and the solution was stirred at room temperature for 18 hours. The reaction solution was dropwise added to 5 liters of super pure water with vigorously stirring and reprecipitated. The obtained resin was dried at 70° C. for 12 hours in a vacuum dryer, thereby resin 1 was obtained. The weight average molecular weight of VP-8000 was 9,800 with GPC measurement polystyrene as standard sample.

Synthesis Examples 17 to 30

Resins 2 to 15 were synthesized in the same manner as in Synthesis Example 16, except for changing vinyl ethers to be added.

The resins synthesized above and the resin used for comparison are shown below.

Resin 1

Resin 2
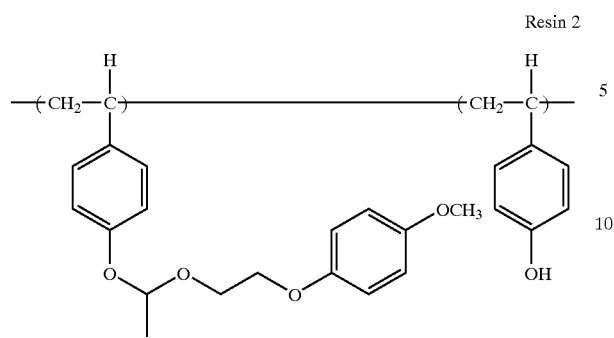
Resin 7
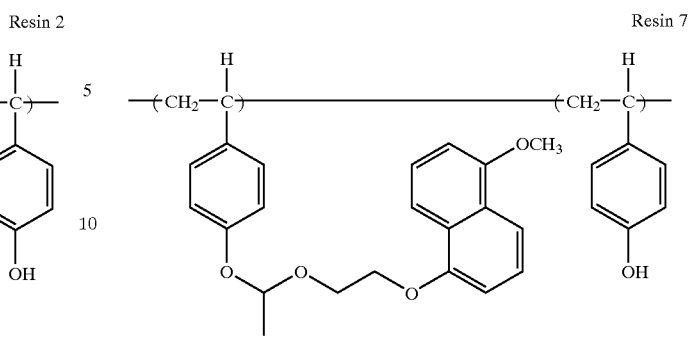
Resin 3
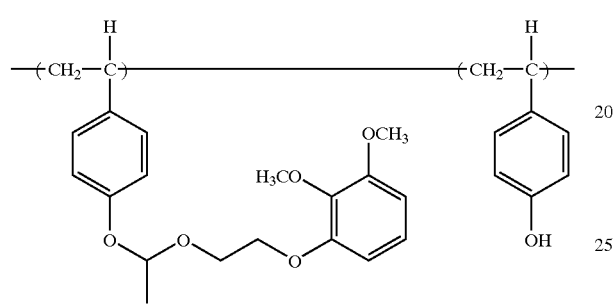
Resin 8
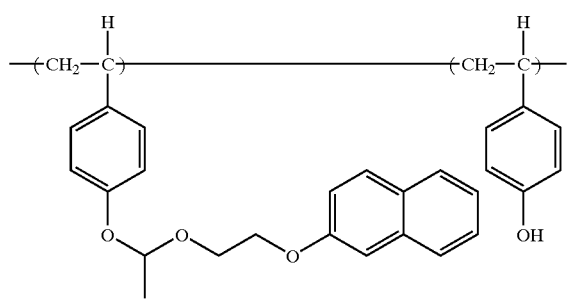
Resin 4
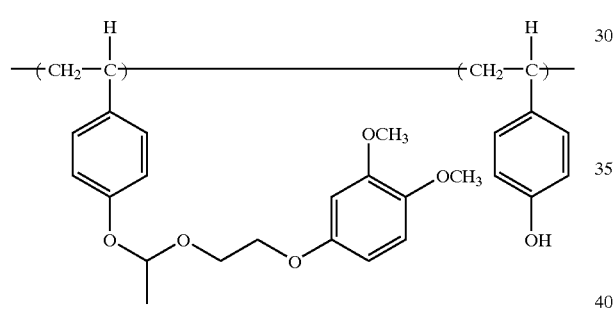
Resin 9
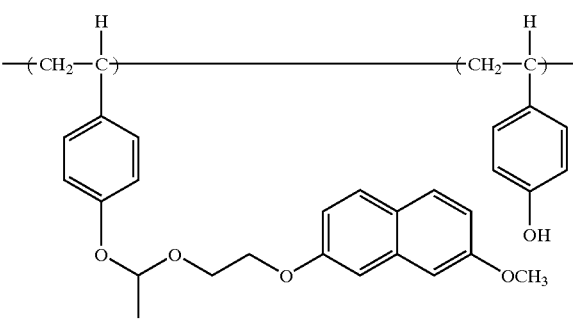
Resin 5
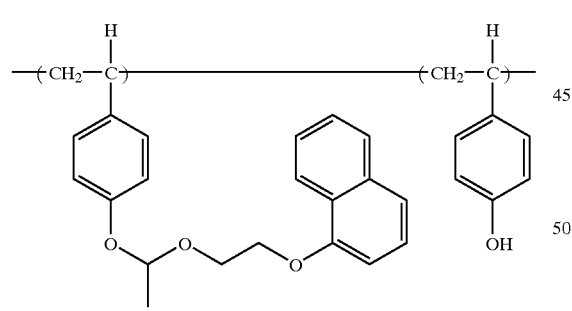
Resin 10
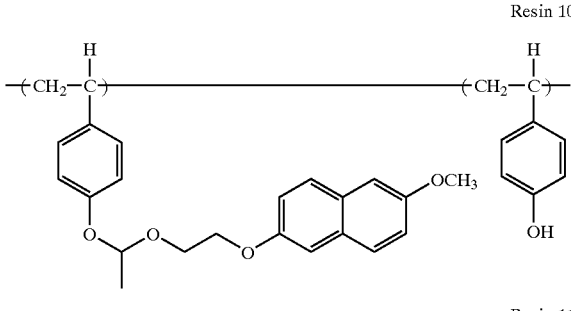
Resin 6
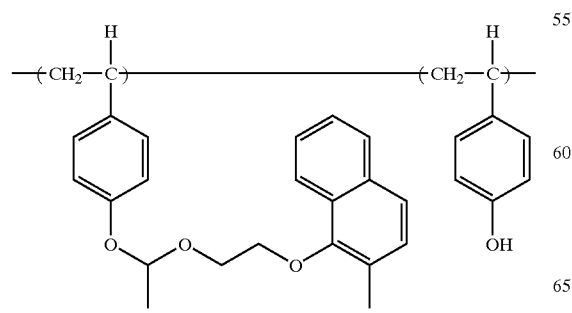
Resin 11
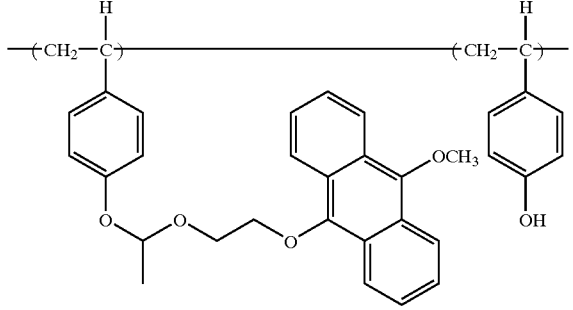

Resin 12

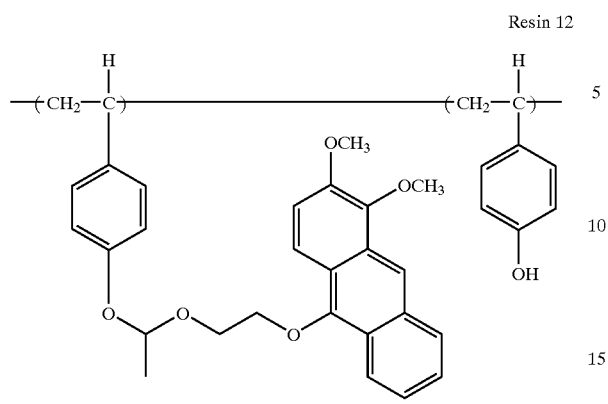

Resin 13

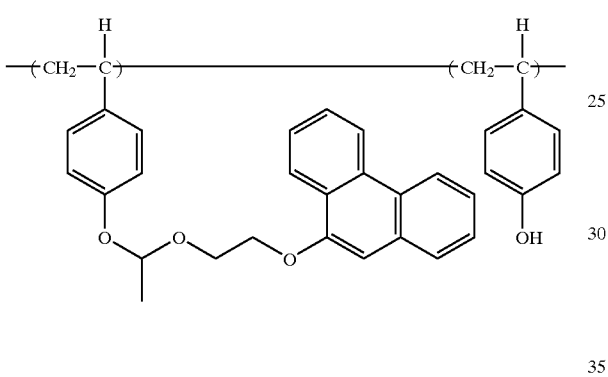

Resin 14

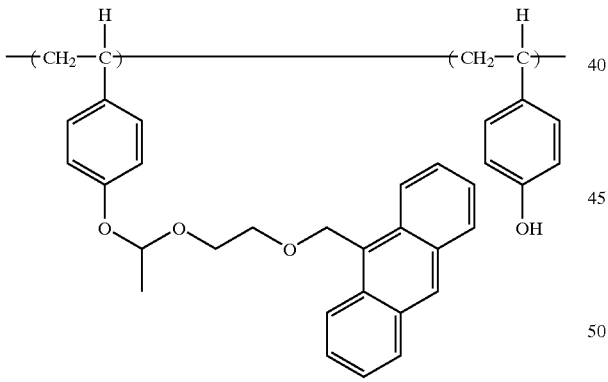

Resin 15

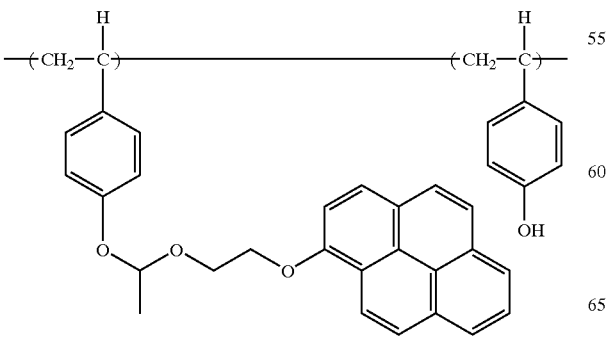

Resin for comparison

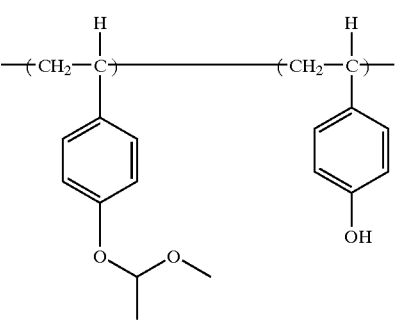

Ip value of H—O—X moiety in the above formula (I) in each of the above resins is as follows. MOPAC (PM3 parameter) of software CAChe4.1.1 (Oxford Molecular Co.) was used in computation (unit: eV).

Resin 1: 8.237
Resin 2: 8.717
Resin 3: 8.783
Resin 4: 8.505
Resin 5: 8.543
Resin 6: 8.469
Resin 7: 8.293
Resin 8: 8.722
Resin 9: 8.715
Resin 10: 8.477
Resin 11: 7.698
Resin 12: 8.029
Resin 13: 8.500
Resin 14: 8.109
Resin 15: 8.015
Comparative resin: 11.132 (target compound of computation: methanol)

The ratio of the repeating unit having a leaving group and weight average molecular weight of each resin are shown below.

| Resin | Ratio of repeating unit having a leaving group (mol %) | Weight Average Molecular Weight |
|---|---|---|
| Resin 1 | 14.8 | 9,800 |
| Resin 2 | 14.2 | 9,800 |
| Resin 3 | 13.3 | 9,700 |
| Resin 4 | 14.5 | 9,800 |
| Resin 5 | 13.1 | 9,600 |
| Resin 6 | 14.2 | 9,700 |
| Resin 7 | 14.7 | 9,400 |
| Resin 8 | 14.4 | 9,700 |
| Resin 9 | 13.4 | 9,500 |
| Resin 10 | 14.2 | 9,800 |
| Resin 11 | 13.1 | 9,600 |
| Resin 12 | 13.8 | 9,400 |
| Resin 13 | 13.5 | 9,200 |
| Resin 14 | 13.2 | 9,700 |
| Resin 15 | 13.4 | 9,900 |
| Resin for Comparison | 14.6 | 9,500 |

2. Example (Examples 1 to 15 and Comparative Example 1)

(1) Coating of Resist

Resin 1 (12 g), acid-generating agent (I-1) (0.11 g), nitrogen-containing basic compound B-1 (0.0065 g) and surfactant W-1 (0.0022 g) were dissolved in 19.5 g of propylene glycol monomethyl ether acetate. The solution was filtered through a Teflon filter having a pore diameter of 0.1 µm to thereby prepare a resist solution of Example 1.

Resist solutions of Examples 2 to 15 and Comparative Example 1 were prepared in the same manner as in Example 1, except for changing the kind of each component as shown in Table 1 below.

The solution of each sample was coated on a silicon wafer with a spin coater, and dried at 120° C. for 90 seconds on a vacuum adsorption type hot plate, thereby a resist film having a film thickness of 0.5 µm was obtained.

(2) Formation of Resist Pattern

Irradiation was performed on each resist film using an electron beam imaging apparatus (applied voltage: 50 KV).

After irradiation, each resist film was heated with a vacuum adsorption type hot plate (110° C. for 60 seconds), immersed in a 2.38% tetramethylammonium hydroxide (TMAH) aqueous solution for 60 seconds, rinsed with water for 30 seconds and dried.

The sectional forms of the obtained contact hole pattern and line and a space pattern were observed with a scanning electron microscope.

(3) Evaluation of Sensitivity and Resolution

The minimum irradiation amount required to resolve 0.20 m line (line/space: 1/1) was taken as sensitivity, and the limiting resolution at the irradiation amount was taken as resolution (line and space are separated and resolved). When 0.20 µm line (line/space: 1/1) was not resolved, a limiting resolution was taken as the resolution, and the irradiation amount at that time was taken as sensitivity.

PED stability was evaluated as follows.

A resist pattern was formed in the same manner as in above (2), except for adding a step of allowing the resist in an electron beam imaging apparatus for 120 minutes after irradiation when the resist pattern was formed. A minimum pattern size which could be obtained with the same irradiation amount as the minimum irradiation amount in the above method (3) (in this case a resist was irradiated immediately after resist film formation) was obtained, and PED stability was evaluated by the difference between the above value and the limiting resolution obtained in (3).

●: Difference in limiting resolution is less than 1%.
○: Difference in limiting resolution is less than 3%.
X: Difference in limiting resolution is less than 3% or higher.

TABLE 1

| Example No. | Resin | Acid-Generating Agent | Nitrogen-Containing Basic Compound | Surfactant |
|---|---|---|---|---|
| 1 | 1 | (I-1) | B-1 | W-1 |
| 2 | 2 | (I-1) | B-1 | W-1 |
| 3 | 3 | (I-3) | B-1 | W-1 |
| 4 | 4 | (I-3) | B-2 | W-1 |
| 5 | 5 | (I-5) | B-2 | W-1 |
| 6 | 6 | (I-5) | B-2 | W-2 |
| 7 | 7 | (I-9) | B-3 | W-2 |
| 8 | 8 | (I-9) | B-3 | W-2 |
| 9 | 9 | (I-16) | B-3 | W-3 |
| 10 | 10 | (I-16) | B-3 | W-3 |
| 11 | 11 | (I-21) | B-3 | W-4 |
| 12 | 12 | (I-21) | B-4 | W-5 |

TABLE 1-continued

| Example No. | Resin | Acid-Generating Agent | Nitrogen-Containing Basic Compound | Surfactant |
|---|---|---|---|---|
| 13 | 13 | (I-21) | B-5 | W-1 |
| 14 | 14 | (III-1) | B-5 | W-1 |
| 15 | 15 | (III-1) | B-5 | W-1 |
| Comparative Example 1 | Comparative resin | (I-1) | B-1 | W-1 |

The abbreviations used in Table 1 are shown below.

The abbreviations with respect to the organic basic compounds are as follows.

B-1; 2,4,5-Triphenylimidazole
B-2; 1,5-Diazabicyclo[4.3.0]nona-5-ene
B-3; 4-Dimethylaminopyridine
B-4; 1,8-Diazabicyclo[5.4.0]undeca-7-ene
B-5: N-Cyclohexyl-N'-morpholinoethylthiourea The abbreviations with respect to the surfactants are as follows.

W-1: Troysol S-366 (manufactured by Troy Chemical Industries Inc.)
W-2: Megafac F176 (manufactured by Dainippon Ink & Chemicals, Co., Ltd.)
W-3: Megafac R08 (manufactured by Dainippon Ink & Chemicals, Co., Ltd.)
W-4: Polysiloxane polymer KP-341 (manufactured by Shin-Etsu Chemical Co., Ltd.)
W-5: Surflon S-382 (manufactured by Asahi Glass Co., Ltd.)

TABLE 2

| Example No. | Sensitivity ($\mu C/cm^2$) | Resolution ($\mu M$) | PED Stability |
|---|---|---|---|
| 1 | 1.0 | 0.04 | ● |
| 2 | 2.0 | 0.05 | ● |
| 3 | 1.5 | 0.04 | ○ |
| 4 | 1.0 | 0.06 | ● |
| 5 | 1.0 | 0.07 | ● |
| 6 | 1.0 | 0.07 | ○ |
| 7 | 1.0 | 0.05 | ● |
| 8 | 2.0 | 0.06 | ● |
| 9 | 1.5 | 0.05 | ● |
| 10 | 1.5 | 0.04 | ● |
| 11 | 0.5 | 0.05 | ○ |
| 12 | 0.5 | 0.04 | ● |
| 13 | 1.0 | 0.07 | ○ |
| 14 | 0.5 | 0.06 | ● |
| 15 | 0.5 | 0.06 | ● |
| Comparative Example 1 | 4.5 | 0.14 | X |

From the results in Table 2, it can be understood that the positive resist composition according to the present invention is high sensitivity, high resolution and excellent in PED stability The same procedures as in Examples 1 to 15 were repeated except for changing the solvent to propylene glycol monomethyl ether acetate/propylene glycol monomethyl ether (80/20 by weight), the same results could be obtained.

(4) Patterning by Proximity X-ray Exposure

A resist film having a film thickness of 0.40 mm was prepared using each of the resist compositions in Examples 1 and 11 and Comparative Example 1 in the same manner as in the above method (1). Patterning was performed in the same manner as in the above (2) except for using an proximity X-ray exposure apparatus (gap value: 20 nm), and the resist performance was evaluated in the same manner as in the above method (3). The results of evaluation are shown in Table 3.

TABLE 3

| Resist Composition | Sensitivity (mJ/cm²) | Resolution (μm) | PED Stability |
|---|---|---|---|
| Example 1 | 60 | 0.10 | ◉ |
| Example 11 | 70 | 0.09 | ○ |
| Comparative Example 1 | 190 | 0.18 | X |

As is apparent from the results in Table 3, the resist composition according to the present invention exhibits extremely excellent performance also with X-ray irradiation.

The positive resist composition to be irradiated with one of an electron beam and X-ray according to the present invention is high sensitivity, high resolution and excellent in PED stability.

While the invention has been described in detail and with reference to specific examples thereof, it will be apparent to one skilled in the art that various changes and modifications can be made therein without departing from the spirit and scope thereof.

The entire disclosure of each and every foreign patent application from which the benefit of foreign priority has been claimed in the present application is incorporated herein by reference, as if fully set forth.

What is claimed is:

1. A positive resist composition to be irradiated with one of an electron beam and X-ray, which comprises:

(a) a compound capable of generating an acid upon irradiation with one of electron beam and X-ray;

(b1) a resin: increasing the solubility in an alkali developer by the action of an acid; and having a group capable of leaving by the action of an acid, in which the leaving group includes a residue of a compound, the compound having a smaller ionization potential value than p-ethylphenol; and (c) a solvent.

2. The positive resist composition as claimed in claim 1, wherein the compound (a) contains at least one compound represented by formula (I'), (II') or (III'):

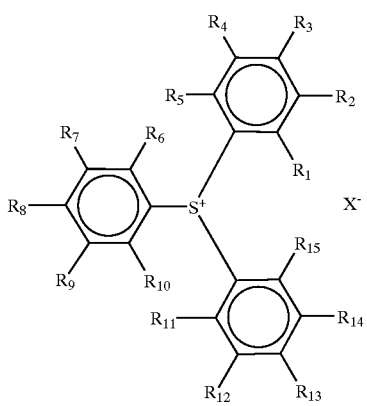

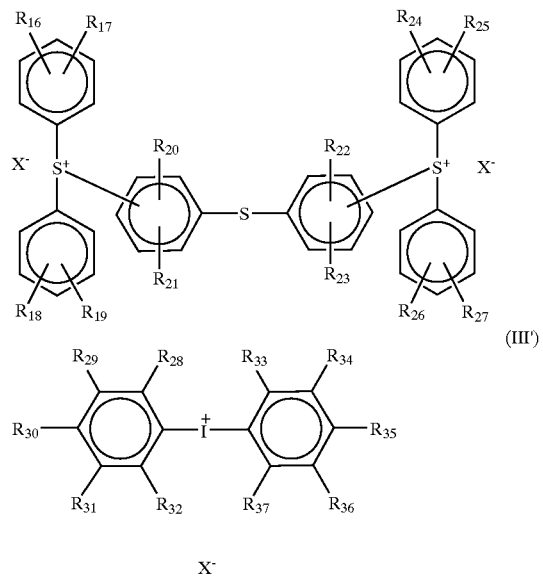

wherein $R_1$ to $R_{37}$, which are the same or different, each represents a hydrogen atom, a straight chain, branched or cyclic alkyl group, a straight chain, branched or cyclic alkoxyl group, a hydroxyl group, a halogen atom, or an —S—$R_{38}$ group; $R_{38}$ represents a straight chain, branched or cyclic alkyl group, or an aryl group; at least two of $R_1$ to $R_{15}$, at least two of $R_{16}$ to $R_{27}$, and at least two of $R_{28}$ to $R_{37}$ may be bonded to form a ring containing at least one selected from a single bond, carbon, oxygen, sulfur and nitrogen; and $X^-$ represents an anion of a sulfonic acid.

3. The positive resist composition as claimed in claim 2, wherein $X^-$ represents an anion of a benzenesulfonic acid, an anion of a naphthalenesulfonic acid or an anion of an anthracenesulfonic acid, each of which contains at least one member selected from the group consisting of:

at least one fluorine atom;

a straight chain, branched or cyclic alkyl group substituted with at least one fluorine atom;

a straight chain, branched or cyclic alkoxyl group substituted with at least one fluorine atom;

an acyl group substituted with at least one fluorine atom;

an acyloxy group substituted with at least one fluorine atom;

a sulfonyl group substituted with at least one fluorine atom;

a sulfonyloxy group substituted with at least one fluorine atom;

a sulfonylamino group substituted with at least one fluorine atom;

an aryl group substituted with at least one fluorine atom;

an aralkyl group substituted with at least one fluorine atom; and an alkoxycarbonyl group substituted with at least one fluorine atom.

4. The positive resist composition as claimed in claim 1, wherein the solvent (c) contains propylene glycol monomethyl ether acetate.

5. The positive resist composition as claimed in claim 1, which further comprises (e) an organic basic compound.

6. The positive resist composition as claimed in claim 1, which further comprises (f) a surfactant containing at least one of a fluorine atom and a silicon atom.

7. A method for forming a pattern comprises: applying the positive resist composition according to claim 1 on a substrate to form a resist film; irradiating the resist film with one of an electron beam and X-ray; and developing the resist film.

8. A positive resist composition to be irradiated with one of an electron beam and X-ray, which comprises:
(a) a compound capable of generating an acid upon irradiation with one of electron beam and X-ray;
(b2) a resin: increasing the solubility in an alkali developer by the action of an acid; and having a repeating unit represented by formula (I):

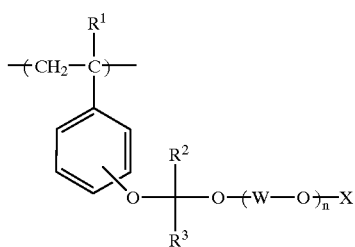
(I)

wherein $R^1$ represents a hydrogen atom or a methyl group; $R^2$ and $R^3$ each independently represents a hydrogen atom or an alkyl group having from 1 to 4 carbon atoms; W represents a divalent organic group; X represents an organic group which satisfies that the ionization potential value of a compound represented by H—O—X is smaller than that of p-ethylphenol; and n represents an integer of from 1 to 4, and when n represents from 2 to 4, a plurality of W's are the same or different; and
(c) a solvent.

9. The positive resist composition as claimed in claim 8, wherein X in formula (I) is represented by formula (II):

(II)

wherein L represents a single bond or an alkylene group; and Y represents a group selected from the following formulae:

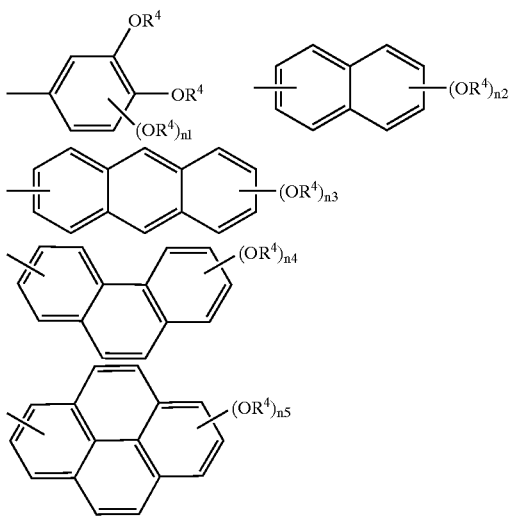

wherein $R^4$ represents a straight chain or branched alkyl group having from 1 to 6 carbon atoms; n1 represents an integer of from 0 to 3; n2 represents an integer of from 0 to 7; n3 represents an integer of from 0 to 9; n4 represents an integer of from 0 to 9; and n5 represents an integer of from 0 to 9.

10. The positive resist composition as claimed in claim 8, wherein the compound (a) contains at least one compound represented by formula (I'), (II') or (III'):

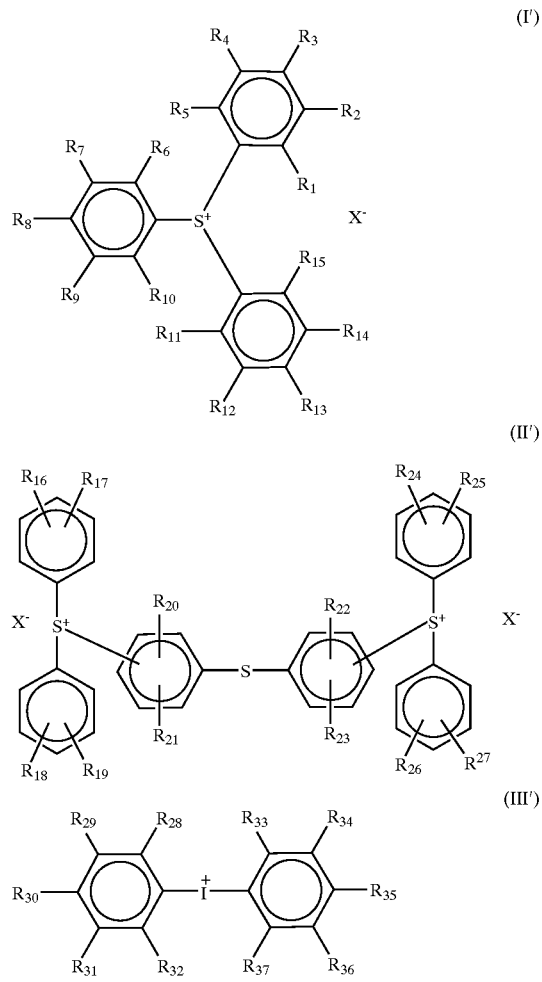

wherein $R_1$ to $R_{37}$, which are the same or different, each represents a hydrogen atom, a straight chain, branched or cyclic alkyl group, a straight chain, branched or cyclic alkoxyl group, a hydroxyl group, a halogen atom, or an —S—$R_{38}$ group; $R_{38}$ represents a straight chain, branched or cyclic alkyl group, or an aryl group; at least two of $R_1$ to $R_{15}$, at least two of $R_{16}$ to $R_{27}$, and at least two of $R_{28}$ to $R_{37}$ may be bonded to form a ring containing at least one selected from a single bond, carbon, oxygen, sulfur and nitrogen; and X$^-$ represents an anion of a sulfonic acid.

11. The positive resist composition as claimed in claim 10, wherein X$^-$ represents an anion of a benzenesulfonic acid, an anion of a naphthalenesulfonic acid or an anion of an anthracenesulfonic acid, each of which contains at least one member selected from the group consisting of:
at least one fluorine atom;
a straight chain, branched or cyclic alkyl group substituted with at least one fluorine atom;
a straight chain, branched or cyclic alkoxyl group substituted with at least one fluorine atom;

an acyl group substituted with at least one fluorine atom;

an acyloxy group substituted with at least one fluorine atom;

a sulfonyl group substituted with at least one fluorine atom;

a sulfonyloxy group substituted with at least one fluorine atom;

a sulfonylamino group substituted with at least one fluorine atom;

an aryl group substituted with at least one fluorine atom;

an aralkyl group substituted with at least one fluorine atom; and an alkoxycarbonyl group substituted with at least one fluorine atom.

12. The positive resist composition as claimed in claim 8, wherein the solvent (c) contains propylene glycol monomethyl ether acetate.

13. The positive resist composition as claimed in claim 8, which further comprises (e) an organic basic compound.

14. The positive resist composition as claimed in claim 8, which further comprises (f) a surfactant containing at least one of a fluorine atom and a silicon atom.

15. A method for forming a pattern comprises: applying the positive resist composition according to claim 8 on a substrate to form a resist film; irradiating the resist film with one of an electron beam and X-ray; and developing the resist film.

* * * * *